United States Patent
Wu et al.

(10) Patent No.: US 12,451,366 B2
(45) Date of Patent: Oct. 21, 2025

(54) SEMICONDUCTOR PACKAGE AND METHOD OF FORMING THEREOF

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/447,428

(22) Filed: Aug. 10, 2023

(65) Prior Publication Data

US 2023/0386866 A1 Nov. 30, 2023

Related U.S. Application Data

(62) Division of application No. 17/458,854, filed on Aug. 27, 2021, now Pat. No. 11,935,761.

(51) Int. Cl.
*H01L 23/48* (2006.01)
*H01L 21/48* (2006.01)
(Continued)

(52) U.S. Cl.
CPC ........ *H01L 21/565* (2013.01); *H01L 21/4853* (2013.01); *H01L 21/486* (2013.01); *H01L 21/561* (2013.01); *H01L 23/3128* (2013.01); *H01L 23/481* (2013.01); *H01L 24/19* (2013.01); *H01L 2224/12105* (2013.01); *H01L 2224/73267* (2013.01)

(58) Field of Classification Search
None
See application file for complete search history.

(56) References Cited

U.S. PATENT DOCUMENTS

| 9,000,584 B2 | 4/2015 | Lin et al. |
| 9,048,222 B2 | 6/2015 | Hung et al. |
| | (Continued) | |

FOREIGN PATENT DOCUMENTS

| CN | 109786262 A | 5/2019 |
| CN | 110299351 A | 10/2019 |
| | (Continued) | |

*Primary Examiner* — Jay C Chang
(74) *Attorney, Agent, or Firm* — Slater Matsil, LLP

(57) ABSTRACT

A method of forming a semiconductor device includes attaching a first local interconnect component to a first substrate with a first adhesive, forming a first redistribution structure over a first side of the first local interconnect component, and removing the first local interconnect component and the first redistribution structure from the first substrate and attaching the first redistribution structure to a second substrate. The method further includes removing the first adhesive from the first local interconnect component and forming an interconnect structure over a second side of the first local interconnect component and the first encapsulant, the second side being opposite the first side. A first conductive feature of the interconnect structure is physically and electrically coupled to a second conductive feature of the first local interconnect component.

20 Claims, 28 Drawing Sheets

(51) Int. Cl.
  *H01L 21/56*  (2006.01)
  *H01L 23/00*  (2006.01)
  *H01L 23/31*  (2006.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,761,571 B2 | 9/2017 | Scanlan |
| 2011/0291288 A1 | 12/2011 | Wu et al. |
| 2012/0037411 A1 | 2/2012 | Hsu et al. |
| 2017/0062383 A1 | 3/2017 | Yee et al. |
| 2019/0006264 A1 | 1/2019 | Vaidya et al. |
| 2019/0103353 A1 | 4/2019 | Liu et al. |
| 2019/0148276 A1 | 5/2019 | Chen et al. |
| 2019/0148329 A1 | 5/2019 | Ting et al. |
| 2019/0295972 A1 | 9/2019 | Tsai et al. |
| 2020/0006214 A1 | 1/2020 | Tsai et al. |
| 2020/0020638 A1 | 1/2020 | Heo et al. |
| 2020/0075488 A1 | 3/2020 | Wu et al. |
| 2020/0083179 A1* | 3/2020 | Lee ............... H01L 23/5384 |
| 2020/0105635 A1* | 4/2020 | Yu ................ H01L 23/3677 |
| 2021/0082871 A1 | 3/2021 | Wu et al. |
| 2021/0167051 A1 | 6/2021 | Yu et al. |
| 2021/0225809 A1 | 7/2021 | Yu et al. |

FOREIGN PATENT DOCUMENTS

| | | |
|---|---|---|
| CN | 110891368 A | 3/2020 |
| DE | 102019113476 A1 | 3/2020 |
| EP | 3605603 A1 | 5/2020 |
| KR | 20180051611 A | 5/2018 |
| KR | 20190055683 A | 5/2019 |
| KR | 20200027419 A | 3/2020 |
| TW | 201843750 A | 12/2018 |
| TW | 201916304 A | 4/2019 |
| TW | 201942986 A | 11/2019 |
| TW | 202002227 A | 1/2020 |
| TW | 202006913 A | 2/2020 |
| TW | 202114100 A | 4/2021 |
| WO | 2019132965 A1 | 7/2019 |

* cited by examiner

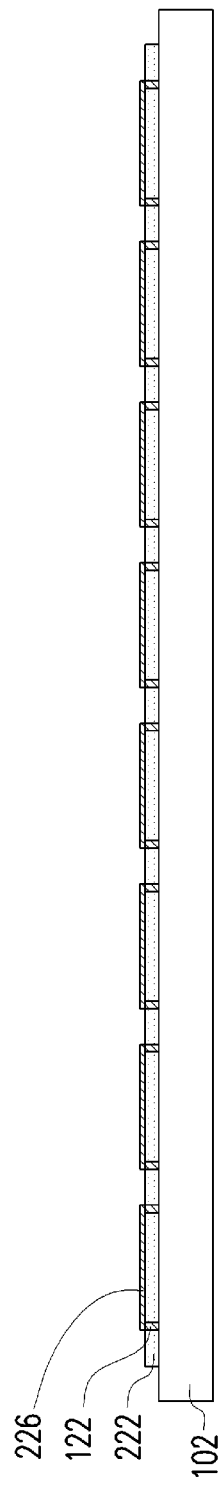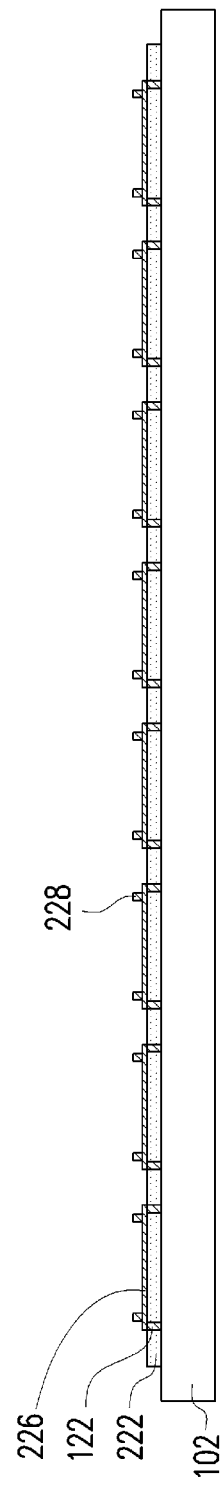

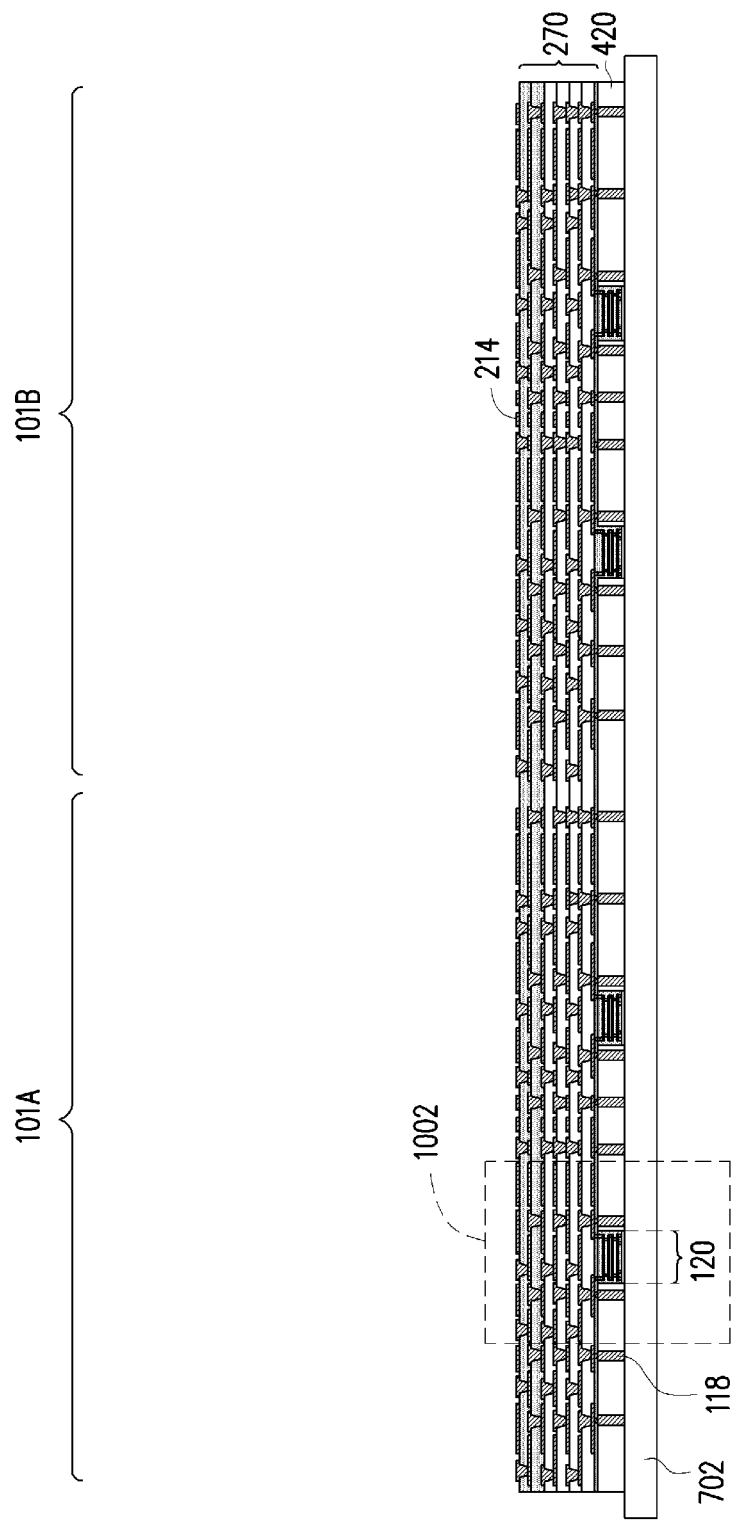

SEMICONDUCTOR PACKAGE AND METHOD OF FORMING THEREOF

PRIORITY CLAIM AND CROSS-REFERENCE

This application is a divisional of U.S. patent application Ser. No. 17/458,854, filed on Aug. 27, 2021, which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4 through 11 illustrate cross-sectional views of intermediate steps during a process for forming a local interconnect component in accordance with some embodiments

DETAILED DESCRIPTION

Figure 1:
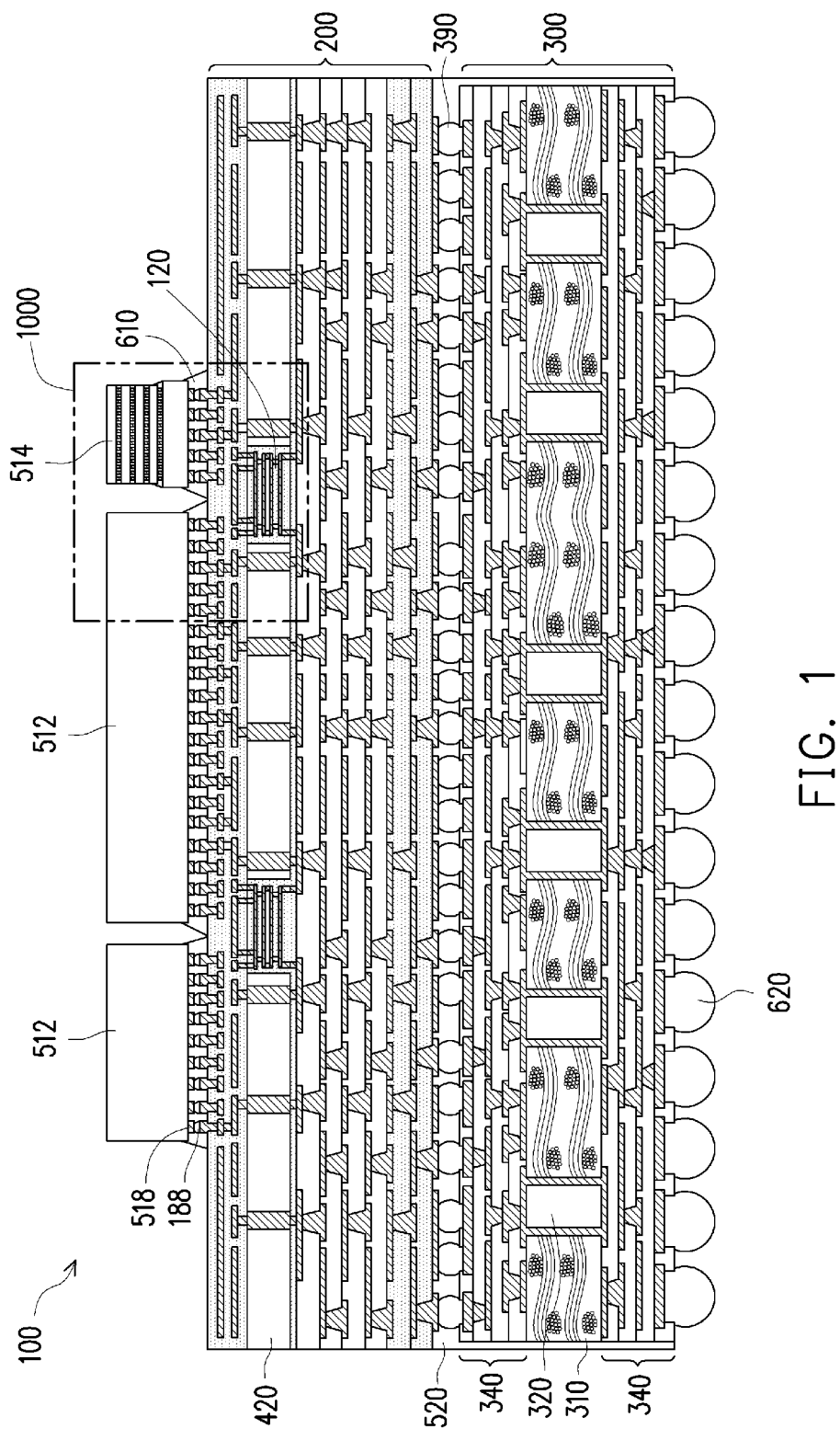
FIG. 1 illustrates a cross-sectional view of a package component in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package component including one or more integrated circuit dies. In some embodiments, the package component is a system-on-integrated-substrate (SoIS) package. The package component includes a double-sided local interconnect component embedded in a redistribution structure. The embedded double-sided local interconnect component may increase the communication bandwidth between the integrated circuit dies and other attached packages such as e.g. core substrates, which may be useful for high performance computing. Forming double-sided local interconnect components without adhesives such as die attach films may allow the reliability window to be enlarged. Using an adhesive such as e.g. a die attach film (DAF) to attach the local interconnect components to a carrier substrate during fabrication of the package component may allow a solder joint attachment process including, e.g., formation of micro bumps on the local interconnect components and formation of micro bump pads on the carrier substrate for to be avoided, which may simplify process flow, increase throughput, and reduce crack formation caused by subsequent removal of the micro bumps and micro bump pads. Higher reliability and improved electrical performance from low contact resistance may be at least in part due to a solder-free connection between the embedded double-sided local interconnect component and the redistribution structure. By not having a solder connection in the final structure, the electromigration issue of solder joints may be reduced.

The redistribution structure is connected to the integrated circuit dies and provides electrical connection between the integrated circuit dies and a core substrate and/or between the integrated circuit dies. The core substrate is additionally connected to a set of external conductive features. In such a manner, the integrated circuit dies are electrically connected to the core substrate, and ultimately to the external conductive features, through the core substrate and the redistribution structure.

In accordance with some embodiments, the redistribution structure, the embedded double-sided local interconnect component, the core substrate, and the integrated circuit dies may be individually fabricated and tested prior to assembling the completed package component. This further increases component and board level reliability.

Due to the increased communication bandwidth between the integrated circuit dies provided by the double-sided local interconnect components, an interposer is not required between the integrated circuit dies and the redistribution structure. The reliability window may be widened by reducing chip package interaction issues through removing the need for an interposer. The warpage mismatch between the integrated circuit package (including the integrated circuit dies) and the core substrate package (including the core substrate and the redistribution structure) may be reduced because the coefficient of thermal expansion (CTE) mismatch between these two package structures is reduced.

Figure 2:
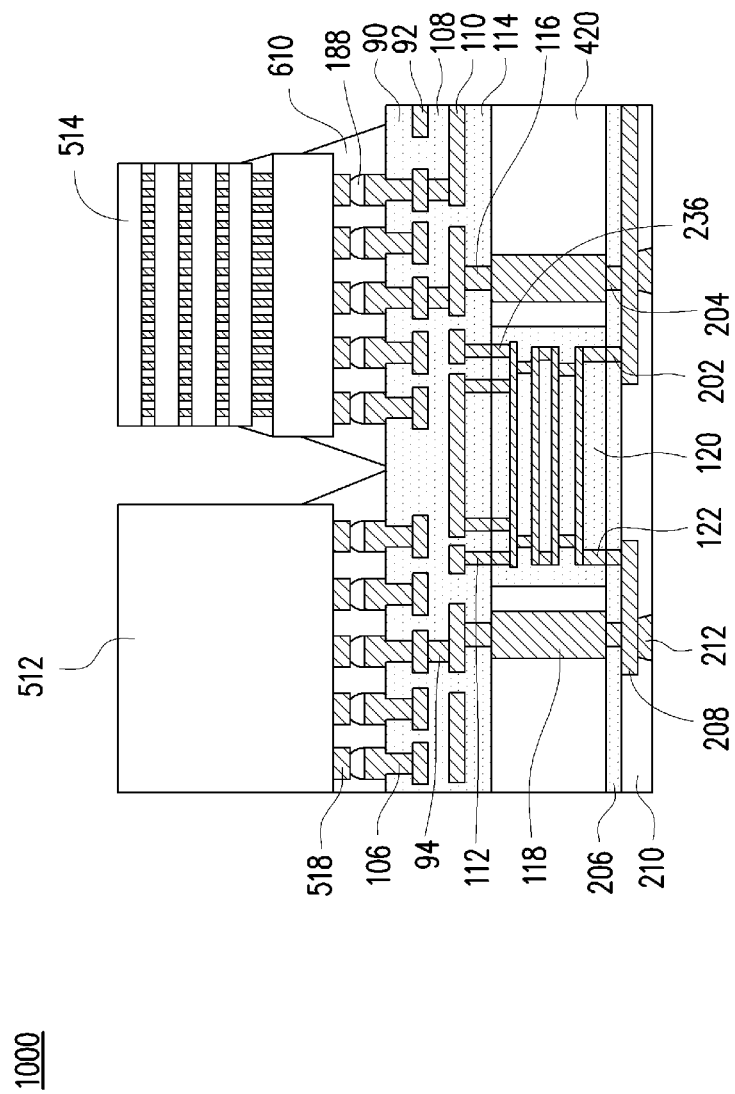
FIG. 2 illustrates a detailed view of a portion of the cross-sectional view of FIG. 1 in accordance with some embodiments.

FIG. 1 illustrates a cross-sectional view of a singulated package component 100 in accordance with some embodiments. FIG. 2 illustrates a detailed view of region 1000 of the cross-sectional view of FIG. 1, in accordance with some embodiments. The singulated package component 100 includes a plurality of integrated circuit dies, a redistribution structure 200 having one or more redistribution layers, a core substrate 300, and external connectors 620, among other elements. The integrated circuit dies may include one or more dies, such as a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In some embodiments, the semiconductor device may be an integrated circuit die.

As shown, the plurality of integrated circuit dies includes one or more logic dies 512, one or more memory dies 514, and one or more input/output (I/O) dies 516 (not shown in FIG. 1, but see FIG. 3) for illustrative purposes. The integrated circuit dies may be formed in one or more wafers, which may include different device regions that are singulated in subsequent steps. The integrated circuit dies may be packaged with other similar or different integrated circuit dies using known manufacturing techniques.

In some embodiments, one or more of the integrated circuit dies 512, 514, and 516 may be stacked devices that include multiple semiconductor substrates. For example, the memory die 514 may be a memory device such as a hybrid memory cube (HMC) module, a high bandwidth memory (HBM) module, or the like that includes multiple memory dies. In such embodiments, the memory die 514 includes multiple semiconductor substrates interconnected by through-substrate vias (TSVs). Each of the semiconductor substrates may (or may not) have an interconnect structure. An encapsulant 520 may surround the integrated circuit dies 512, 514, and 516.

The dies 512, 514, and 516 have bond pads 518 that are bonded to the conductive connectors 188. In some embodiments, the bond pads 518 are made of a conductive material and may be similar to the conductive lines (see, e.g., conductive lines 110) described below.

Conductive connectors 188 may provide electrical connection through between the redistribution structure 200 and the integrated circuit dies 512, 514, and 516. An underfill 610 may be included to securely bond integrated circuit dies 512, 514, and 516 to the redistribution structure 200 and provide structural support and environmental protection.

As discussed in greater detail below, the redistribution structure 200 provides electrical pathing and connection between the integrated circuit dies 512, 514, and 516 and a core substrate 300 by way of conductive connectors 390. In some embodiments, the redistribution structure 200 has one or more redistribution layers comprising metallization patterns, comprising, for example, conductive lines 92 and 110 and conductive vias 94, 106, 112, and 116, and dielectric layers 90, 108, and 114 on top and bottom sides of the conductive lines 92 and 110. The conductive lines 92 and 110 and conductive vias 94, 106, 112, and 116 may electrically couple to the integrated circuit dies 512, 514, and 516.

As discussed in greater detail below, the redistribution structure 200 includes one or more local interconnect components 120. The local interconnect components 120 provide electrical routing and connection between the integrated circuit dies 512, 514, and 516 and may be referred to as interconnecting dies 120 or local interconnect structures 120. As illustrated in FIGS. 1 and 2, conductive features 236 of the local interconnect components 120 are physically and electrically coupled to conductive vias 112 of the redistribution structure 200 in a solder-free connection, which may reduce the electromigration issue of solder joints. The local interconnect components 120 increase the communication bandwidth between the integrated circuit dies 512-516 while maintaining low contact resistance and high reliability. The low contact resistance and high reliability is at least in part due to the solder-free connection between the embedded local interconnect component 120 and the redistribution structure 200.

Due to the increased communication bandwidth between the integrated circuit dies provided by the local interconnect components, an interposer is not required between the integrated circuit dies and the redistribution structure. By removing the need for an interposer, the warpage mismatch between the integrated circuit package (including the integrated circuit dies) and the core substrate package (including the core substrate and the redistribution structure) is reduced because the coefficient of thermal expansion (CTE) mismatch between these two package structures is reduced.

The local interconnect components 120 are further electrically connected on their bottom sides to the core substrate 300 by way of conductive connectors 390. This double-sided connection of the integrated circuit dies 512, 514, and 516 to the core substrate 300 may provide high bandwidth communication with lower resistance, which may enable increasing signal and power integrity.

As discussed in greater detail below, the local interconnect components 120 may be encapsulated by an encapsulant 420, also referred to as an underfill 420, which may be formed of a molding compound, epoxy, or the like, and may be applied by compression molding, transfer molding, or the like. Through vias 118 may extend through the encapsulant 420 adjacent to the local interconnect components 120 and may be electrically coupled to the conductive lines 110 by conductive vias 116 extending through the dielectric layer 114.

As discussed in greater detail below, the local interconnect components 120, through vias 118, and encapsulant 420 may be disposed on one or more redistribution layers comprising metallization patterns, comprising, for example, conductive lines 208 and conductive vias 202, 204, and 212, and dielectric layers 206 and 210 on top and bottom sides of the conductive lines 208. The through vias 118 may be physically and electrically coupled on bottom sides to the conductive vias 204. Conductive connectors 122 such as metal pillars, e.g. copper pillars, on the bottom side of the local interconnect components 120 may be bonded to the conductive vias 202 by metal-to-metal bonding such as e.g.

copper-to-copper bonding. In some embodiments, the local interconnect components 120 are bonded to the conductive vias 202 and the dielectric layer 206 by hybrid bonding.

The conductive vias 202 and 204 may be electrically coupled to the conductive lines 208, which may be electrically coupled to conductive vias 212 extending to a bottom surface of the dielectric layer 210. Conductive pads 214 on a bottom side of the redistribution structure 200 may be electrically coupled to the conductive vias 212.

The redistribution structure 200 may be electrically and mechanically attached to the core substrate 300. The core substrate 300 may include a central core 310, with conductive vias 320 extending through the central core 310, and additional optional redistribution structures 340 along opposing sides of the central core 310. Generally, the core substrate 300 provides structural support for the component package, as well as providing electrical signal routing between the integrated circuit package and the external connectors 620, which may be physically and electrically coupled to the conductive pads 214.

Encapsulant 520 may be included between the redistribution structure 200 and the core substrate 300 to securely bond the associated elements and provide structural support and environmental protection. The encapsulant 520 may be formed of or comprise an organic material such as a molding compound, a molding underfill, an epoxy, a resin, or the like.

Figure 3:
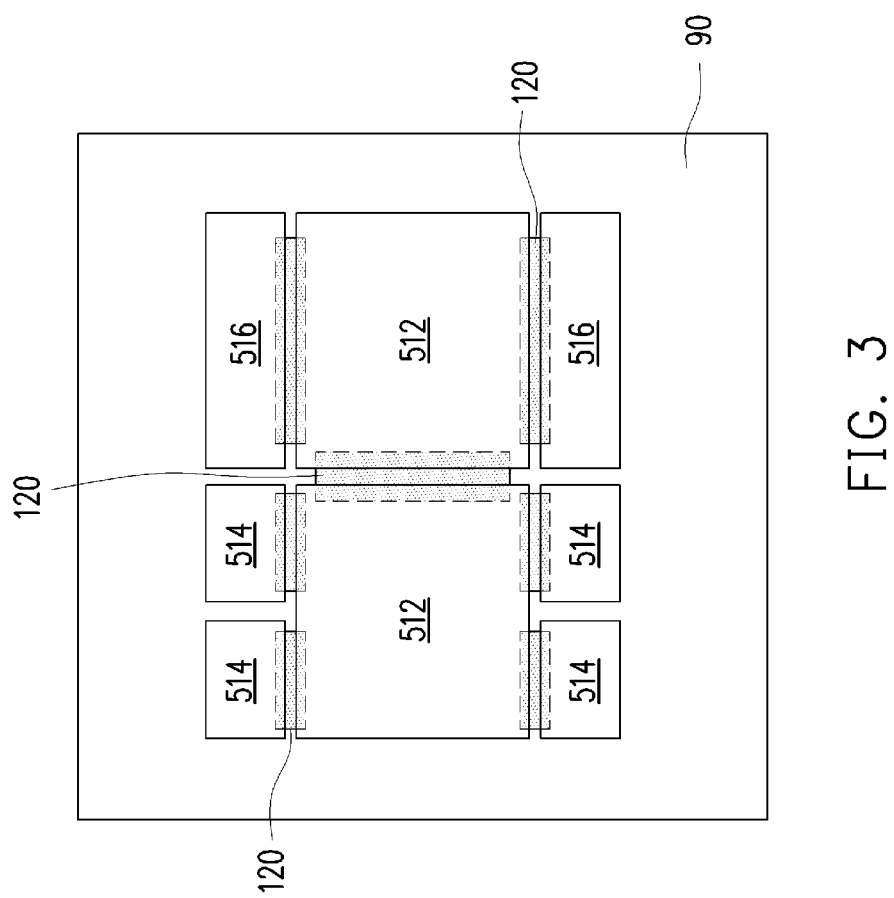
FIG. 3 illustrates a plan view of a package component in accordance with some embodiments.

FIG. 3 illustrates a plan view of the package component in accordance with some embodiments. The embodiment illustrated in FIG. 3 includes two logic dies 512, four memory dies 514, two I/O dies 516, and seven local interconnect components 120. In this embodiment, a first logic die 512 is connected to a first memory die 514 through a first local interconnect component 120 (see above, FIGS. 1-2), the first logic die 512 is connected to a second memory die 514 through a second local interconnect component 120, the first logic die 512 is connected to a third memory die 514 through a third local interconnect component 120, and the first logic die 512 is connected to a fourth memory die 514 through a fourth local interconnect component 120. A second logic die 512 is connected to a first I/O die 516 through a fifth local interconnect component 120 and the second logic die 512 is connected to a second I/O die 516 through a sixth local interconnect component 120. In addition, the first logic die 512 and the second logic die 512 are connected together by a seventh local interconnect component 120. In some embodiments, the logic dies 512 are connected to each other by a single local interconnect component 120 and the other dies are connected to each other through redistribution layers in the redistribution structure 200. Other embodiments may include more or less logic dies 512, memory dies 514, I/O dies 516, and local interconnect components 120. In some embodiments, each of the integrated circuit dies are connected to each adjacent integrated circuit die by a local interconnect component.

FIGS. 4 through 11 illustrates various intermediate stages in fabricating a local interconnect component (see FIG. 10), in accordance with some embodiments. The illustrations of the individual features have been simplified in FIGS. 4 through 16 for ease of illustration.

Figure 4:

Referring first to FIG. 4, a carrier substrate 102 is provided. The carrier substrate 102 may be a glass carrier substrate, a ceramic carrier substrate, a semiconductor substrate, such as a bulk semiconductor, or the like. The carrier substrate 102 may be a wafer, such that multiple redistribution structures can be formed on the carrier substrate 102 simultaneously. The carrier substrate 102 may comprise silicon, doped or undoped, or an active layer of a semiconductor-on-insulator (SOI) substrate. The carrier substrate 102 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, the carrier substrate 102 may be made up of a ceramic material, a polymer film, a magnetic material, the like or a combination thereof. Other substrates, such as multi-layered or gradient substrates, may also be used. The carrier substrate 102 has an active surface (e.g., the surface facing upwards in FIG. 4), sometimes called a front side, and an inactive surface (e.g., the surface facing downwards in FIG. 4), sometimes called a back side.

Figure 5:
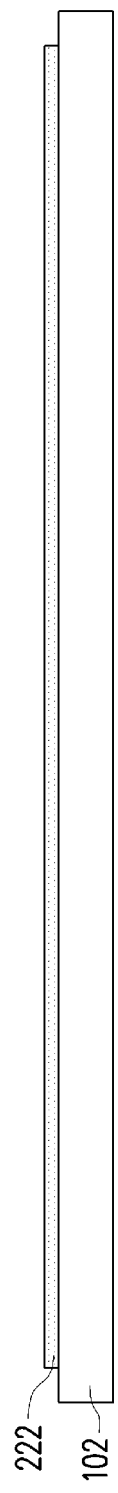

In FIG. 5, a dielectric layer 222 may be formed on the carrier substrate 102. The bottom surface of the dielectric layer 222 may be in contact with the top surface of the carrier substrate 102. The dielectric layer 222 may be formed of polyimide, photo-imageable dielectric (PID), pre-preg, Ajinomoto Build-up Film (ABF), resin coated copper (RCC), molding compound, molding film, epoxy, or the like, and may be applied by compression molding, transfer molding, a combination thereof, or the like. The dielectric layer 222 may be formed by any acceptable deposition process, such as spin coating, CVD, laminating, the like, or a combination thereof.

In some embodiments, the dielectric layer 222 has a thickness in a range of 0.5 µm to 30 µm, such as 4 µm. The dielectric layer 222 having a thickness in a range of 0.5 µm to 30 µm may be useful because it may be advantageous for interconnect impedance control. The dielectric layer 222 having a thickness less than 0.5 µm may be disadvantageous because it may lead to lower reliability and a higher risk of yield loss. The dielectric layer 222 having a thickness greater than 30 µm may be disadvantageous because it may lead to mismatching Serializer/Deserializer (SerDes) impedance control.

Figure 6:
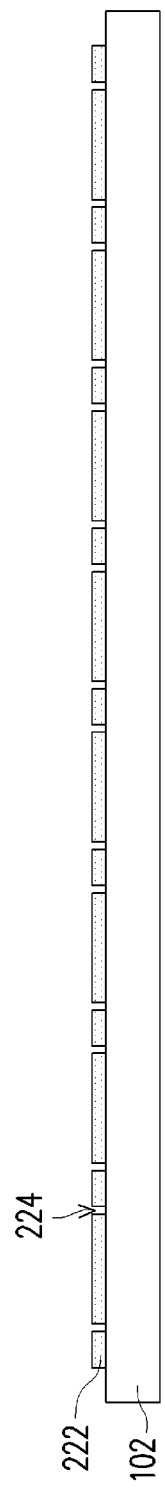

In FIG. 6, the dielectric layer 222 is then patterned to form openings 224 exposing portions of the top surface of the carrier substrate 102. The patterning may be formed by an acceptable process, such as a lithographic process including exposing the dielectric layer 222 to light when the dielectric layer 222 is a photo-sensitive material or by etching using, for example, an anisotropic etch. If the dielectric layer 222 is a photo-sensitive material, the dielectric layer 222 can be developed after the exposure.

In FIG. 7, a metallization pattern including conductive elements such as conductive lines 226 extending along the major surface of the dielectric layer 222 and conductive connectors 122 extending through the dielectric layer 222 to fill the openings 224. As an example to form the metallization pattern, a seed layer is formed over the dielectric layer 222 and in the openings 224 extending through the dielectric layer 22. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the conductive lines 226 of the metallization pattern. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive connectors 122, such as metal pillars e.g. copper pillars, and conductive lines 226 of the metallization pattern. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

In some embodiments, the conductive connectors 122 have widths in a range of 2 µm to 35 µm, which may be useful for providing lower interconnect resistance. The conductive connectors 122 having widths less than 2 µm may be disadvantageous because it may lead to higher resistance and a worse reliability window. The conductive connectors 122 having widths greater than 35 µm may be disadvantageous because it may lead to undesirably dense routing.

In some embodiments, the conductive connectors 122 have heights in a range of 2 µm to 30 µm, which may be useful for providing lower interconnect resistance. The conductive connectors 122 having heights less than 2 µm may be disadvantageous because it may lead to yield loss due to leakage. The conductive connectors 122 having heights greater than 30 µm may be disadvantageous because it may lead to a worse reliability window.

In some embodiments, the conductive lines 226 have thicknesses in a range of 0.5 µm to 10 µm, such as 2 µm. The conductive lines 226 having thicknesses in a range of 0.5 µm to 10 µm may be useful for providing lower interconnect resistance. The conductive lines 226 having thicknesses less than 0.5 µm may be disadvantageous because it may lead to increased interconnect resistance. The conductive lines 226 having thicknesses greater than 10 µm may be disadvantageous because it may lead to yield loss from under etching.

In some embodiments, the conductive lines 226 have spaces between neighboring conductive lines 226 in a range of 0.5 µm to 10 µm, such as 2 µm. The conductive lines 226 having spaces in a range of 0.5 µm to 10 µm may be useful for improved routing performance. The conductive lines 226 having spaces less than 0.5 µm may be disadvantageous because it may lead to yield loss due to shorts within redistribution layers. The conductive lines 226 having spaces greater than 10 µm may be disadvantageous because it may lead to worse routing density.

In some embodiments, the conductive lines 226 have widths in a range of 0.5 µm to 10 µm, such as 2 µm. The conductive lines 226 having widths in a range of 0.5 µm to 10 µm may be useful for providing lower interconnect resistance. The conductive lines 226 having widths less than 0.5 µm may be disadvantageous because it may lead to increased interconnect resistance. The conductive lines 226 having widths greater than 10 µm may be disadvantageous because it may lead to worse routing density.

In FIG. 8, conductive vias 228 are formed on the conductive lines 226. As an example to form the conductive vias 228, a photoresist is formed and patterned over the structure. The photoresist may be formed by spin coating or the like and may be exposed to light for patterning. The patterning forms openings through the photoresist to expose conductive lines 226, where the openings in the photoresist correspond to the conductive vias 228. A conductive material is then formed in the openings of the photoresist and on the exposed portions of the conductive lines 226. The conductive material may be formed by plating, such as electroplating or electroless plating, or the like. The conductive material may comprise a metal, like copper, titanium, tungsten, aluminum, or the like. The conductive material forms the conductive vias 106. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

In some embodiments, the conductive vias 228 have widths in a range of 2 µm to 55 µm, such as 7 µm. The conductive vias 228 having widths in a range of 2 µm to 55 µm may be useful for providing lower interconnect resistance. The conductive vias 228 having widths less than 2 µm may be disadvantageous because it may lead to increased interconnect resistance. The conductive vias 228 having widths greater than 55 µm may be disadvantageous because it may lead to worse routing density.

In some embodiments, the conductive vias 228 have heights in a range of 0.5 µm to 30 µm, such as 4 µm. The conductive vias 228 having height in a range of 0.5 µm to 30 µm may be useful for improved routing capacity. The conductive vias 228 having heights less than 0.5 µm may be because it may lead to yield loss due to leakage. The conductive vias 228 having heights greater than 30 µm may be disadvantageous because it may lead to a worse reliability window.

Figure 9:
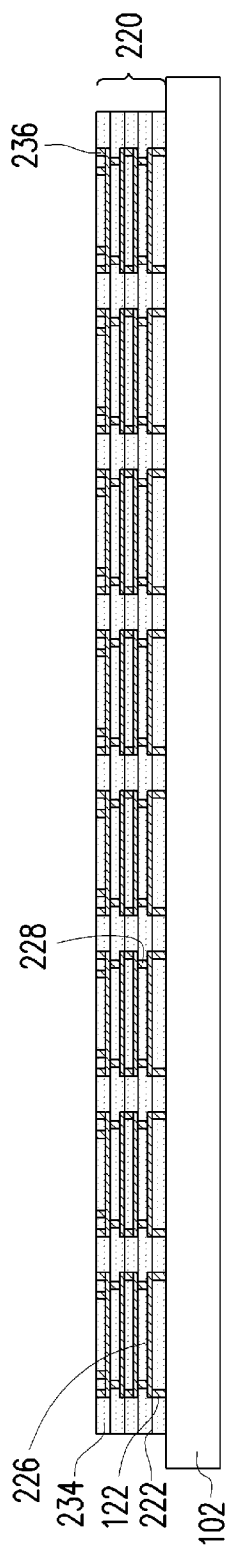

In FIG. 9, a redistribution structure 220 is fabricated by forming additional redistribution layers comprising dielectric layers with embedded metallization patterns comprising conductive lines and vias on the dielectric layer 222 and the conductive lines 226. In some embodiments, the additional dielectric materials may have a same material composition and dimensions as the dielectric layer 222. In other embodiments, the redistribution structure comprises a hybrid dielectric in which some of the additional dielectric layers may have different compositions from the dielectric layer 222 and from each other. As an example, the dielectric layer 222 may comprise a polymer such as e.g. polyimide and the dielectric layer 234 may comprise a molding compound or molding film. In some embodiments, for example, alternating dielectric layers are polyimide and molding compound.

The conductive lines and vias are arranged so that the redistribution structure 220 may be subsequently be singulated into local interconnect components (see below, FIGS. 10-11). In the illustrated embodiment, five redistribution layers are formed in the redistribution structure 220, but any suitable number of redistribution layers may be formed, such as two to ten redistribution layers. The dielectric layers, conductive lines, and vias may be formed using similar methods and materials as the dielectric layer 222, the conductive connectors 122, and the conductive lines 226. The metallization patterns are formed so that conductive vias 236 extending to a top surface of the dielectric layer 234 (on a top surface of the redistribution structure 220) are electrically coupled to neighboring conductive vias 236, also referred to as conductive connectors 236 or conductive pads 236, and to conductive connectors 122 extending to the bottom side of the redistribution structure 220. In some embodiments, the conductive connectors 236 are conductive pads comprising a metal such as e.g. copper.

In some embodiments, the conductive connectors 236 have heights in a range of 2 µm to 30 µm, which may be useful for improved routing capacity. The conductive connectors 236 having heights less than 2 µm may be disadvantageous because it may lead to yield loss due to trace cracking. The conductive connectors 236 having heights greater than 30 µm may be disadvantageous because it may lead to yield loss due to under etching.

In some embodiments, neighboring conductive connectors 236 are separated by pitches in a range of 20 µm to 80 µm, which may be useful for improved routing capacity. Neighboring conductive connectors 236 being separated by pitches less than 20 µm may be disadvantageous because it may lead to worse reliability. Neighboring conductive connectors 236 being separated by pitches greater than 80 µm may be disadvantageous because it may lead to worse routing density.

Figure 10:
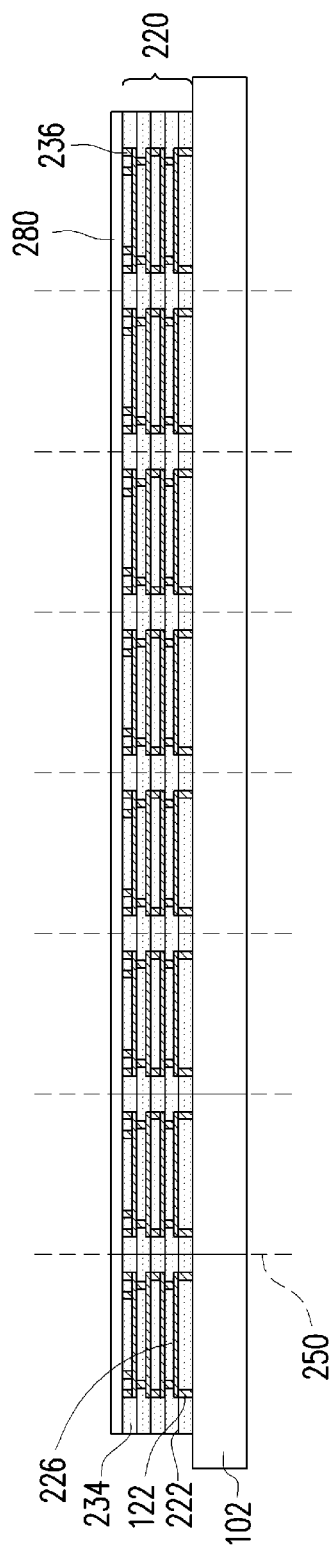

In FIG. 10, an adhesive 280 is formed over the redistribution structure 220. The adhesive 280 may subsequently be used to attach individual local interconnect components to a carrier substrate (see below, FIG. 12). Using the adhesive 280 to attach the local interconnect components to the carrier substrate may allow subsequent formation of micro bumps on the local interconnect components and subsequent formation of micro bump pads on the carrier substrate for a solder joint attachment process to be avoided, which may simplify process flow and increase throughput. The adhesive 280 may be any suitable adhesive, epoxy, die attach film (DAF), or the like. In some embodiments, the adhesive 280 has a thickness in a range of 5 µm to 100 µm, such as 25 µm.

Further in FIG. 10, a singulation process is performed by sawing along scribe lines 250. The sawing singulates redistribution structure 220 to form multiple singulated local interconnect components 120 (see below, FIG. 10).

Figure 11:
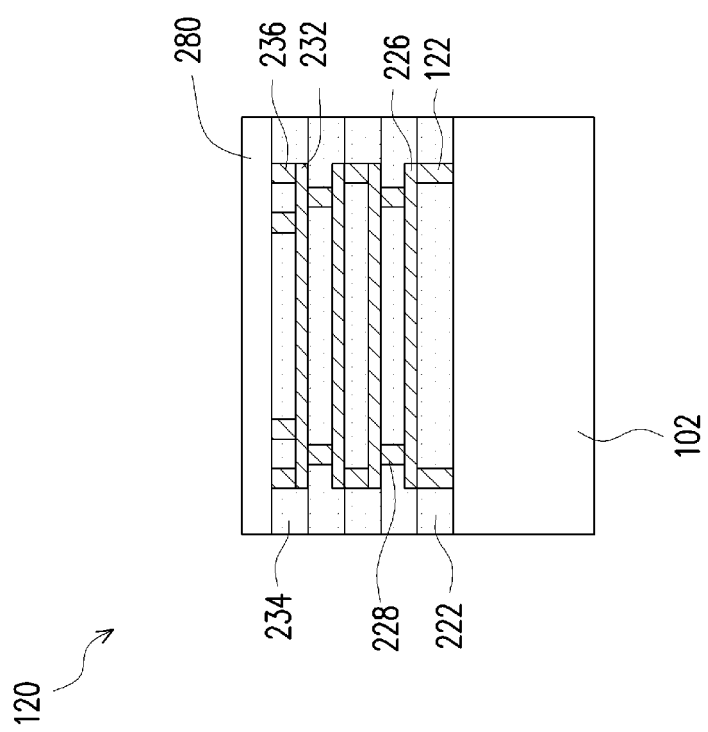

FIG. 11 illustrates a singulated local interconnect component 120, also referred to as a local interconnect component 120 or local interconnect structure 120. In the illustrated embodiment, the local interconnect component 120 has five redistribution layers. In other embodiments, local interconnect components 120 may have two to ten redistribution layers. The first redistribution layer of the illustrated local interconnect component 120, comprising the dielectric layer 222 and conductive connectors 122, is on a top surface of a remaining portion of the carrier substrate 102. Conductive connectors 122 extend through the dielectric layer 222 to the top surface of the remaining portion of the carrier substrate 102 and are electrically coupled to conductive lines 226. The conductive connectors 122 may subsequently be used to couple to other components such as core substrates 300 (see above, FIGS. 1 and 2). The conductive lines 226 are coupled through intermediate conductive features such as additional conductive vias and lines to conductive lines 232 in a top redistribution layers of the local interconnect component 120. The conductive lines 232 may be coupled to conductive vias 236, which may be subsequently used to couple integrated circuit dies 512, 514, and 516 to each other and to other components such as a core substrate 300 (see above, FIGS. 1 and 2). The double-sided connection of the integrated circuit dies 512, 514, and 516 to each other and to the core substrate 300 through the local interconnect component 120 may increase the communication bandwidth between the integrated circuit dies while maintaining low contact resistance and high reliability, which may achieve high signal integrity and power integrity.

In some embodiments, the local interconnect component 120 has a horizontal width in a range of 2 mm to 50 mm, and a horizontal length in a range of 3 mm to 80 mm. The thickness of the singulated portion of carrier substrate may be in a range of 2 mm to 31 mm, such as 18 mm.

FIGS. 12 through 30 illustrates various intermediate stages in fabricating a redistribution structure 200 (see FIG. 20), in accordance with some embodiments. A first package region 101A and a second package region 101B are illustrated where each package region is eventually singulated from other package regions. The illustrations of the individual features have been simplified in FIGS. 12 through 30 for ease of illustration.

Figure 12:
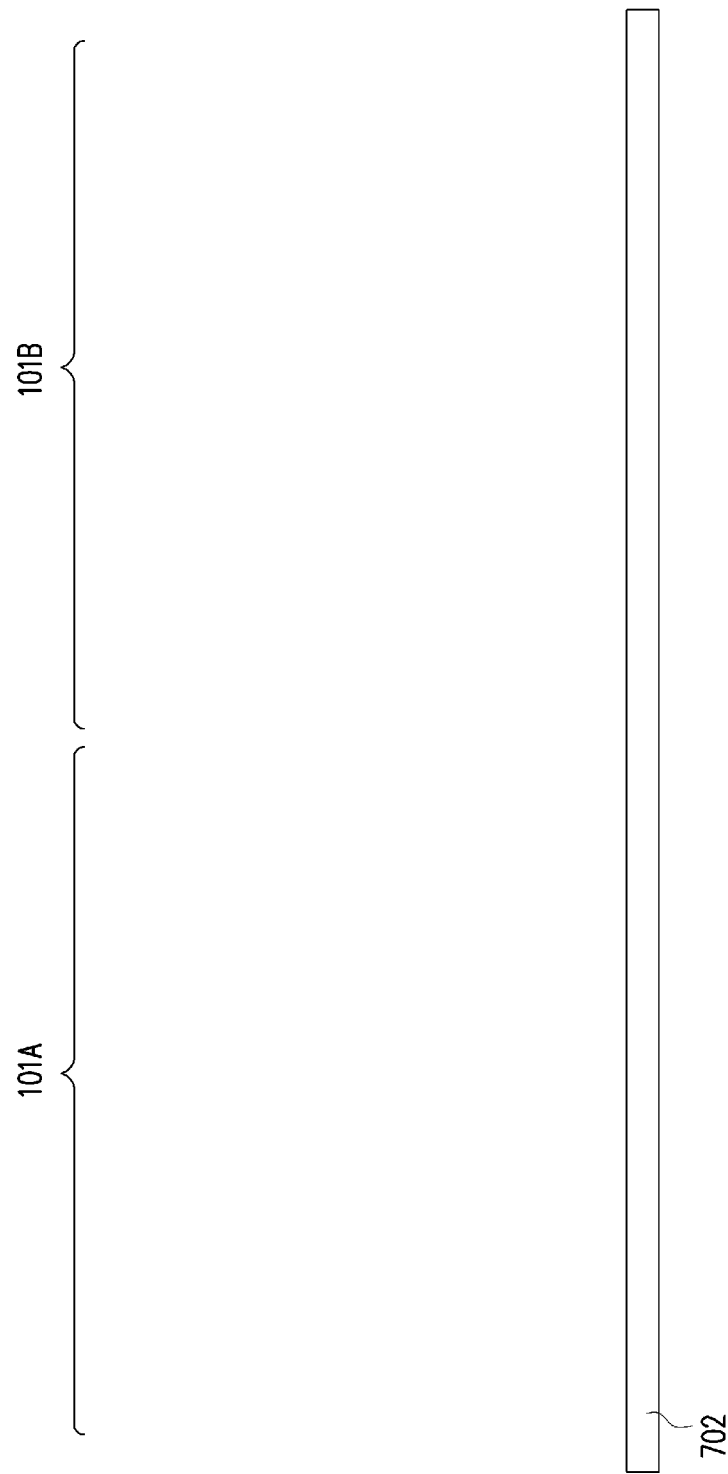
FIGS. 12 through 24 and 27 through 30 illustrate cross-sectional views of intermediate steps during a process for forming a package component in accordance with some embodiments.

Referring first to FIG. 12, a carrier substrate 702 is provided. The carrier substrate 702 may be a glass carrier substrate, a ceramic carrier substrate, or the like. The carrier substrate 702 may be a wafer, such that multiple redistribution structures can be formed on the carrier substrate 702 simultaneously. The carrier substrate 702 may have a release layer (not illustrated) over its top surface. The release layer may be formed of a polymer-based material, which may be removed along with the carrier substrate 702 from the overlying structures that will be formed in subsequent steps. In some embodiments, the release layer is an epoxy-based thermal-release material, which loses its adhesive property when heated, such as a light-to-heat-conversion (LTHC) release coating. In other embodiments, the release layer may be an ultra-violet (UV) glue, which loses its adhesive property when exposed to UV lights. The release layer may be dispensed as a liquid and cured, may be a laminate film laminated onto the carrier substrate 702, or may be the like. The top surface of the release layer may be leveled and be planar within process variations.

Figure 13:
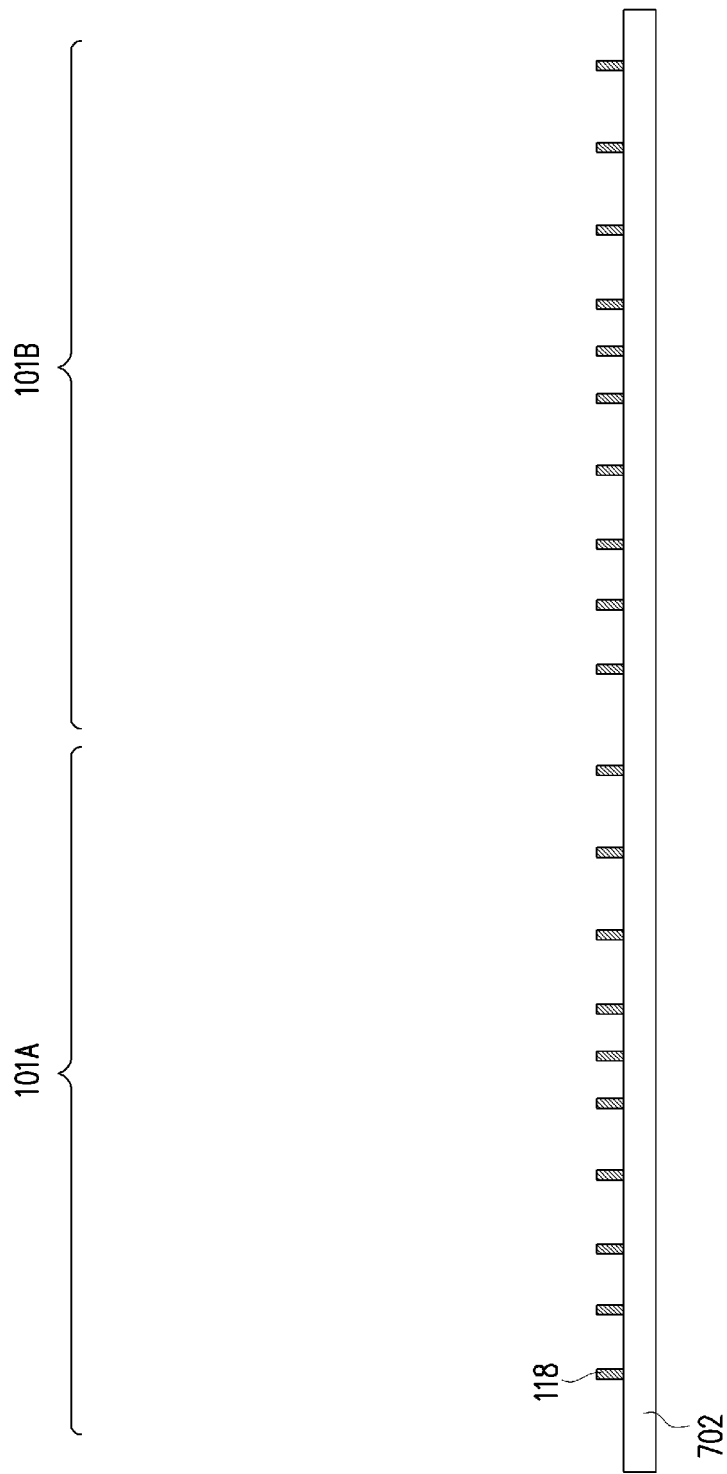

In FIG. 13, through vias 118, also referred to as through molding vias (TMVs) 118, are formed on the carrier substrate 702. As an example to form the through vias 118, a seed layer (not shown) is formed over the carrier substrate 702. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 118.

Figure 14:
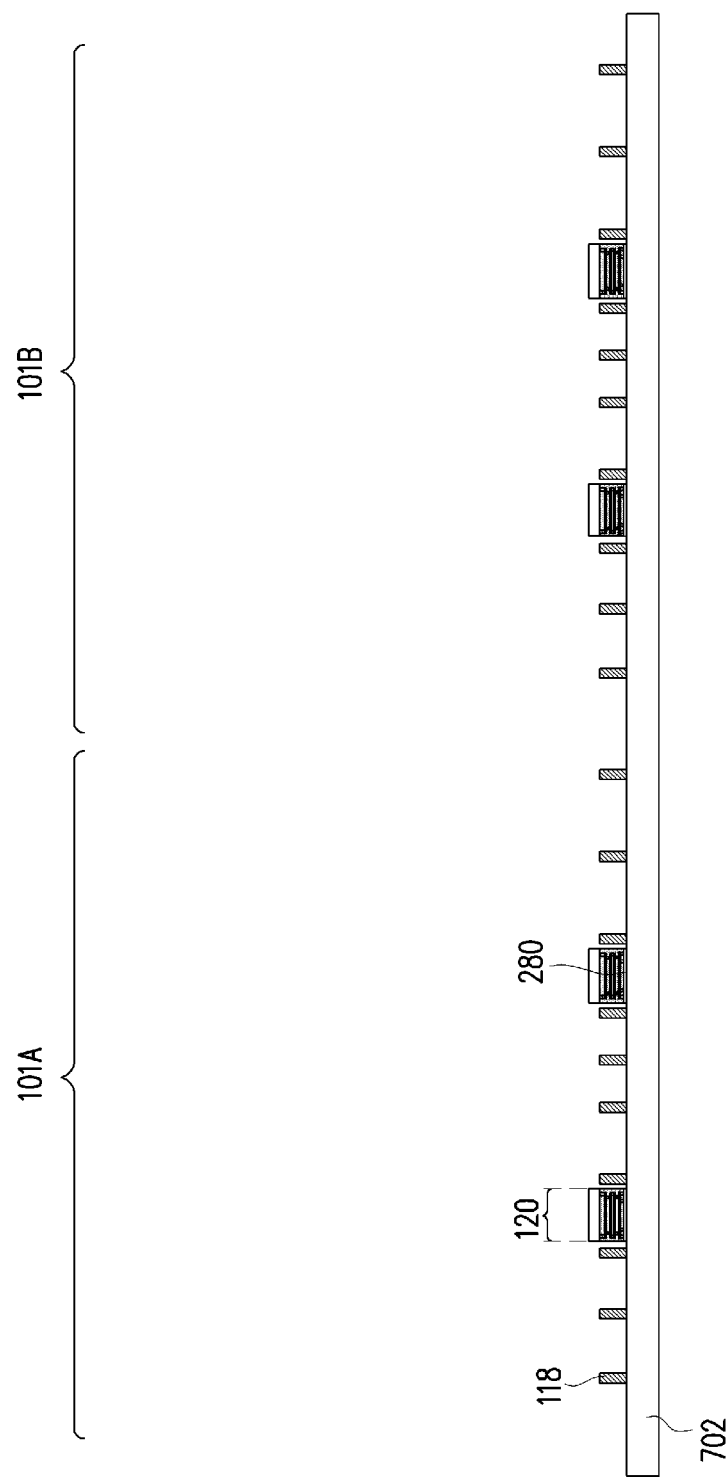

In FIG. 14, local interconnect components 120 are attached to the carrier substrate 702. The local interconnect components 120 may be placed on the carrier substrate 702 using a pick and place process or another suitable process and adhered to the release layer (not illustrated) of the carrier substrate 702 by the adhesive 280 using, for example, a pick-and-place tool. Using the adhesive 280 to attach the local interconnect components 120 to the carrier substrate 702 may allow a solder joint attachment process such as, e.g., formation of micro bumps on the local interconnect components 120 and formation of micro bump pads on the carrier substrate 102 to be avoided, which may simplify process flow, increase throughput, and reduce crack formation caused by subsequent removal of the micro bumps and micro bump pads.

Figure 15:
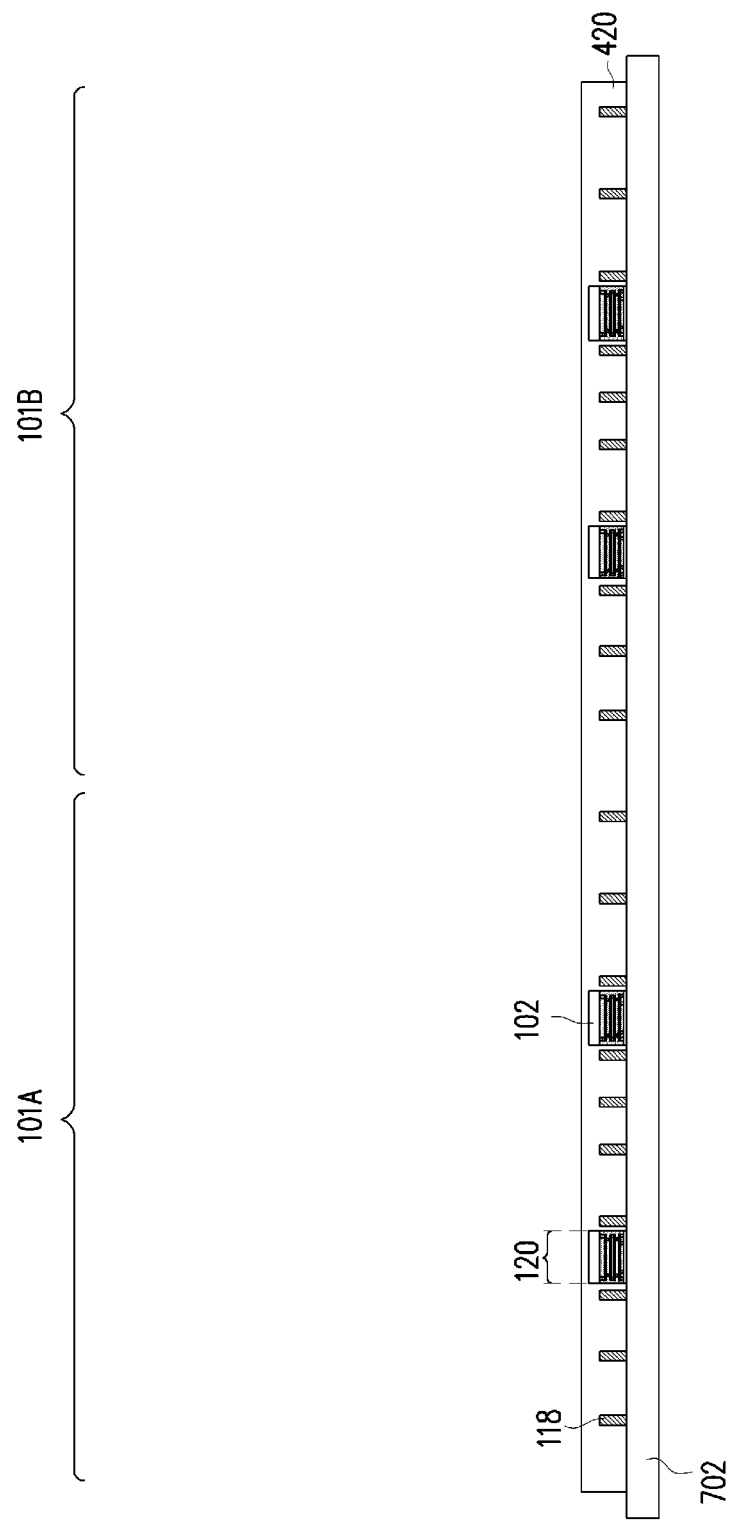

In FIG. 15, an encapsulant 420 is formed on and around the through vias 118 and the local interconnect components 120 in accordance with some embodiments. The encapsulant 420 encapsulates the local interconnect components 120 and the through vias 118. In some embodiments, the encapsulant 420 may be formed of pre-preg, Ajinomoto Build-up Film (ABF), resin coated copper (RCC), molding compound, polyimide, photo-imageable dielectric (PID), epoxy, epoxy molding compound, dispense molding underfill, or the like, and may be applied by compression molding, transfer molding, or the like. The encapsulant may be applied in liquid or semi-liquid form and then subsequently cured. In some embodiments, the encapsulant 420 is formed over the carrier substrate 702 such that the through vias 118 and local interconnect components 120 are buried or covered.

Figure 16:
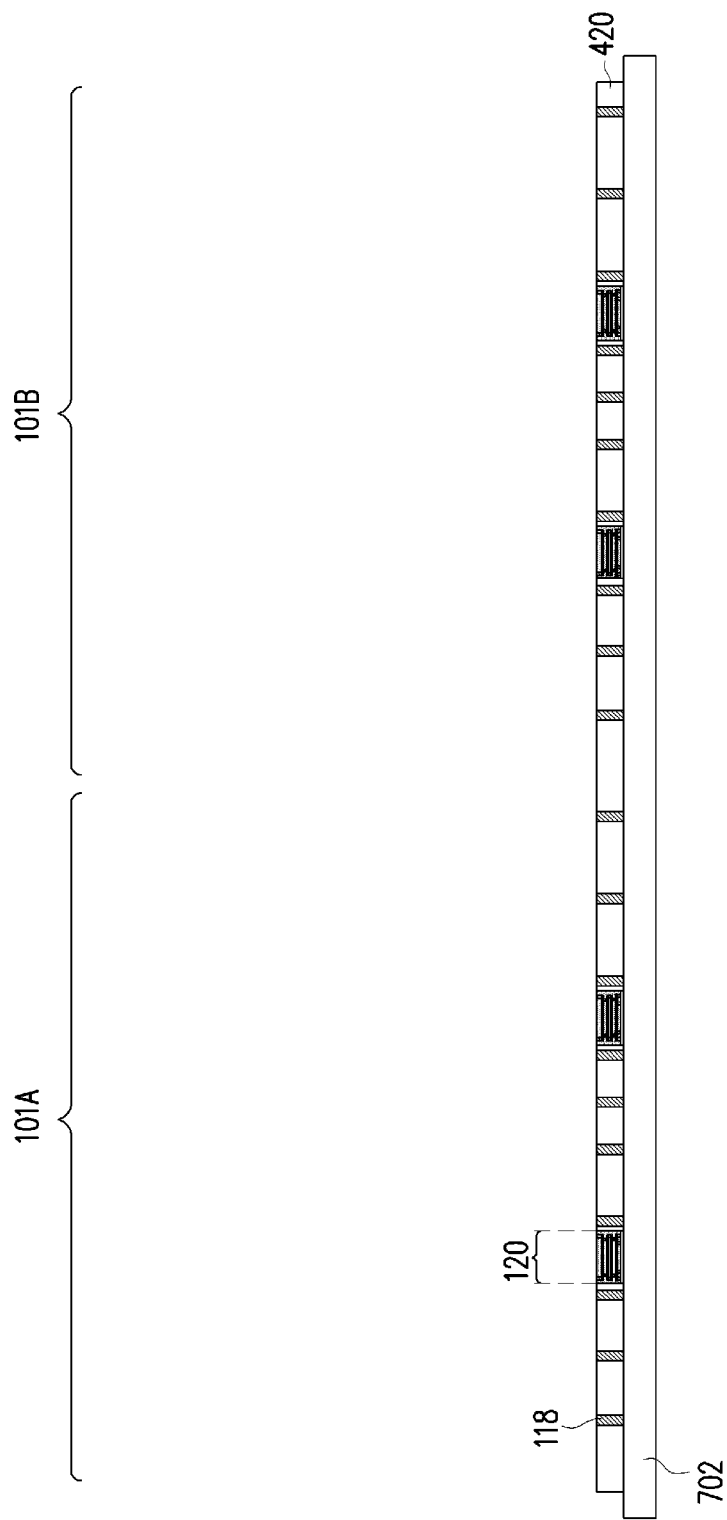

In FIG. 16, a planarization process is performed to remove a top portion of the encapsulant 420 and the substrates 102 of the local interconnect components 120 to expose the through vias 118 and the conductive connectors 122 of the local interconnect components 120. Topmost surfaces of the encapsulant 420, through vias 118, and the conductive connectors 122 (see above, FIG. 10) of the local interconnect components 120 are level (e.g., planar) within process variations after the planarization process. The planarization process may be, for example, a grinding or a chemical-mechanical polish (CMP). In some embodiments, the encapsulant 420 may comprise other materials, such as silicon oxide, silicon nitride, or the like.

The local interconnect components 120 provide electrical connection between the subsequently attached integrated circuit dies (e.g., 512, 514, and 516) and other components such as the core substrate 300. The embedded local interconnect components 120 may increase the communication bandwidth between the integrated circuit dies and the core substrate 300 while maintaining low contact resistance and high reliability. In some embodiments, other components such as an integrated voltage regulator, an integrated passive device, a static random-access-memory, the like, or a combination thereof can also be embedded in a similar manner as the embedded local interconnect component.

Figure 17B:
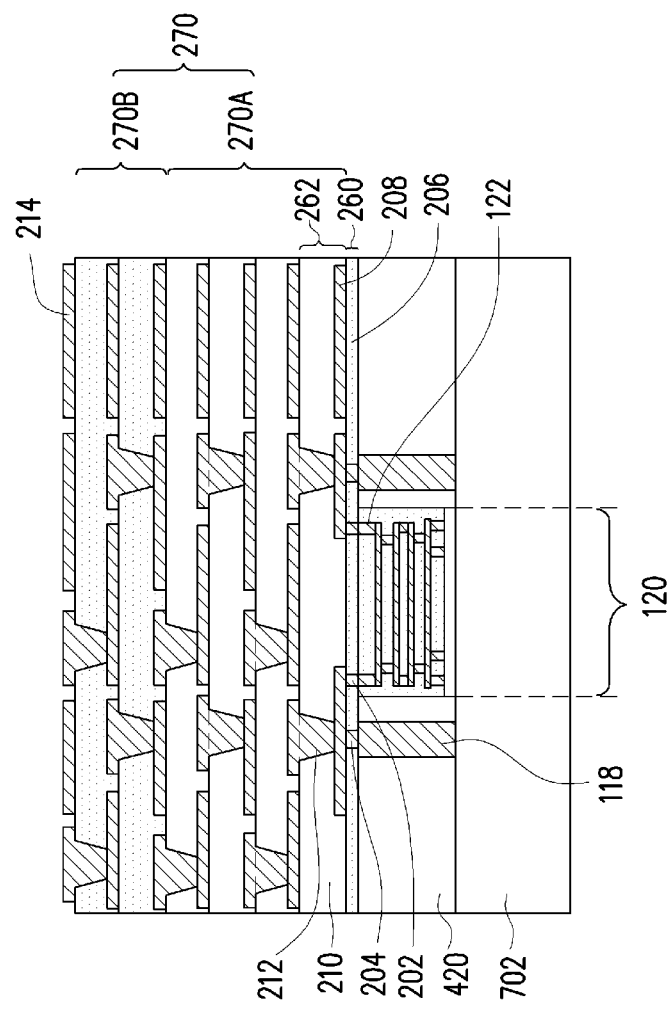

FIGS. 17A and 17B illustrate a redistribution structure 270, also referred to as an interconnect structure 270 or a back-side redistribution structure 270, being formed over the encapsulant 420, through vias 118, and local interconnect components 120. FIG. 17B illustrates a detailed cross-sectional view of region 1002 of FIG. 17A. Although the embodiments illustrated in accordance with FIGS. 17A and 17B show the back-side redistribution structure 270 with six redistribution layers, any suitable number of redistribution layers may be formed, such as from one to twenty redistribution layers. The redistribution structure 270 may be used to couple the through vias 118 and local interconnect components 120 to subsequently attached components such as e.g. core substrates 300 (see above, FIGS. 1 and 2).

The redistribution structure 270 may have a bottom redistribution layer 260 formed over and physically contacting the encapsulant 420, through vias 118, and local interconnect components 120. The redistribution layer 260 comprises a dielectric layer 206 and conductive vias 202 and 204 extending through the dielectric layer 206 to couple the conductive connectors 122 of the local interconnect components 120 and the through vias 118, respectively. The dielectric layer 206 may be formed on the encapsulant 420, the through vias 118, and the local interconnect components 120. In some embodiments, the dielectric layer 108 is formed of a polymer, such as polybenzoxazole (PBO), polyimide, benzocyclobutene (BCB), or the like. In other embodiments, the dielectric layer 206 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 206 may be formed by any acceptable deposition process, such as spin coating, CVD, laminating, the like, or a combination thereof.

In some embodiments, the conductive vias 202 and 204 are formed with a damascene process in which the dielectric layer 206 is patterned and etched utilizing photolithography techniques to form trenches corresponding to the desired pattern of conductive vias, such as over the through vias 118 and the conductive connectors 122 of the local interconnect components 120. An optional diffusion barrier and/or optional adhesion layer may be deposited and the trenches may be filled with a conductive material. Suitable materials for the barrier layer includes titanium, titanium nitride, titanium oxide, tantalum, tantalum nitride, titanium oxide, or other alternatives, and suitable materials for the conductive material include copper, silver, gold, tungsten, aluminum, combinations thereof, or the like. In an embodiment, the conductive vias 202 and 204 may be formed by depositing a seed layer of copper or a copper alloy, and filling the trenches by electroplating. A chemical mechanical planarization (CMP) process or the like may be used to remove excess conductive material from a surface of the dielectric layer 206 and to planarize the surface for subsequent processing.

Still referring to FIGS. 17A and 17B, a redistribution layer 262 is formed on the redistribution layer 260. The redistribution layer 262 comprises conductive features such as a conductive lines 208 and conductive vias 212 embedded in a dielectric layer 210. The conductive lines 208 and conductive vias 212 may couple the conductive vias 202 and 204 to subsequently attached components such as e.g. core substrates 300 (see above, FIGS. 1 and 2).

As an example to form the redistribution layer 262, a seed layer is formed over the dielectric layer 206 and the conductive vias 202 and 204. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the conductive lines 208. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the conductive lines 208. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

Still referring to FIGS. 17A and 17B, conductive vias 212 are formed on and extending from the conductive lines 208. As an example to form the conductive vias 212, a photoresist is formed and patterned on the conductive lines 208. The photoresist may be formed by spin coating or the like and may be exposed to light for patterning. The patterning forms openings through the photoresist to expose the conductive lines 208, where the openings in the photoresist correspond to the conductive vias 212. A conductive material is then formed in the openings of the photoresist and on the exposed portions of the conductive lines 208. The conductive material may be formed by plating, such as electroplating or electroless plating, or the like. The conductive material may comprise a metal, like copper, titanium, tungsten, aluminum, or the like. The conductive material forms the conductive vias 212. The photoresist is then removed. The photoresist may be removed by an acceptable ashing or stripping process, such as using an oxygen plasma or the like. In some embodiments, the conductive vias 212 have widths in a range of 2 μm to 100 μm, such as 30 μm.

Further referring to FIGS. 17A and 17B, a dielectric layer 210 is formed on and around the conductive lines 208 and the conductive vias 212 in accordance with some embodiments. After formation, the dielectric layer 210 surrounds the conductive vias 212 and conductive lines 208. The dielectric layer 210 and metallization pattern, including conductive vias 212 and conductive lines 208, form the redistribution layer 262. In some embodiments, the dielectric layer 210 is formed of a polymer, such as polybenzoxazole (PBO), polyimide, benzocyclobutene (BCB), or the like. In other embodiments, the dielectric layer 210 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 210 may be formed by any acceptable deposition process, such as spin coating, CVD, laminating, the like, or a combination thereof. In still other embodiments, the dielectric layer 210 may be formed of pre-preg, Ajinomoto Build-up Film (ABF), resin coated copper (RCC), molding compound, polyimide, photo-imageable dielectric (PID), epoxy, epoxy molding compound, or the like, and may be applied by compression molding, transfer molding, or the like. The dielectric material may be applied in liquid or semi-liquid form and then subsequently cured to form the dielectric layer 210.

In some embodiments, the dielectric layer 210 is formed over the dielectric layer 206 such that the conductive lines 208 and conductive vias 212 are buried or covered, and a planarization process is then performed on the dielectric layer 210 to expose the conductive vias 212. Topmost surfaces of the dielectric layer 210 and conductive vias 212 are level (e.g., planar) within process variations after the planarization process. The planarization process may be, for example, a CMP.

Additional redistribution layers of the redistribution structure 270 may be formed over the redistribution layer 262 using the same methods and materials as described above with respect to the redistribution layer 262. The dielectric layers of the additional redistribution layers may be formed using any of the materials described above with respect to the dielectric layer 210. In some embodiments, some of the additional dielectric layers are formed with a polymer such as e.g. polyimide and some are formed with a molding compound. In some embodiments in accordance with FIG. 17B, redistribution layers 270A (including redistribution layer 262) comprise dielectric layers formed with a molding compound, and redistribution layers 270B comprise dielectric layers formed with a polymer such as e.g. polyimide. However, any suitable material may be used for any numbers of redistribution layers in any order.

Still referring to FIGS. 17A and 17B, conductive pads 214 are formed on the redistribution structure 270 and electrically coupled to the conductive vias 212. External connectors may subsequently be formed on conductive pads 214 to couple to external devices such as e.g. core substrates 300 (see above, FIGS. 1 and 2). The conductive pads may be formed using similar methods and materials as described above with respect to the conductive lines 208.

Figure 18:
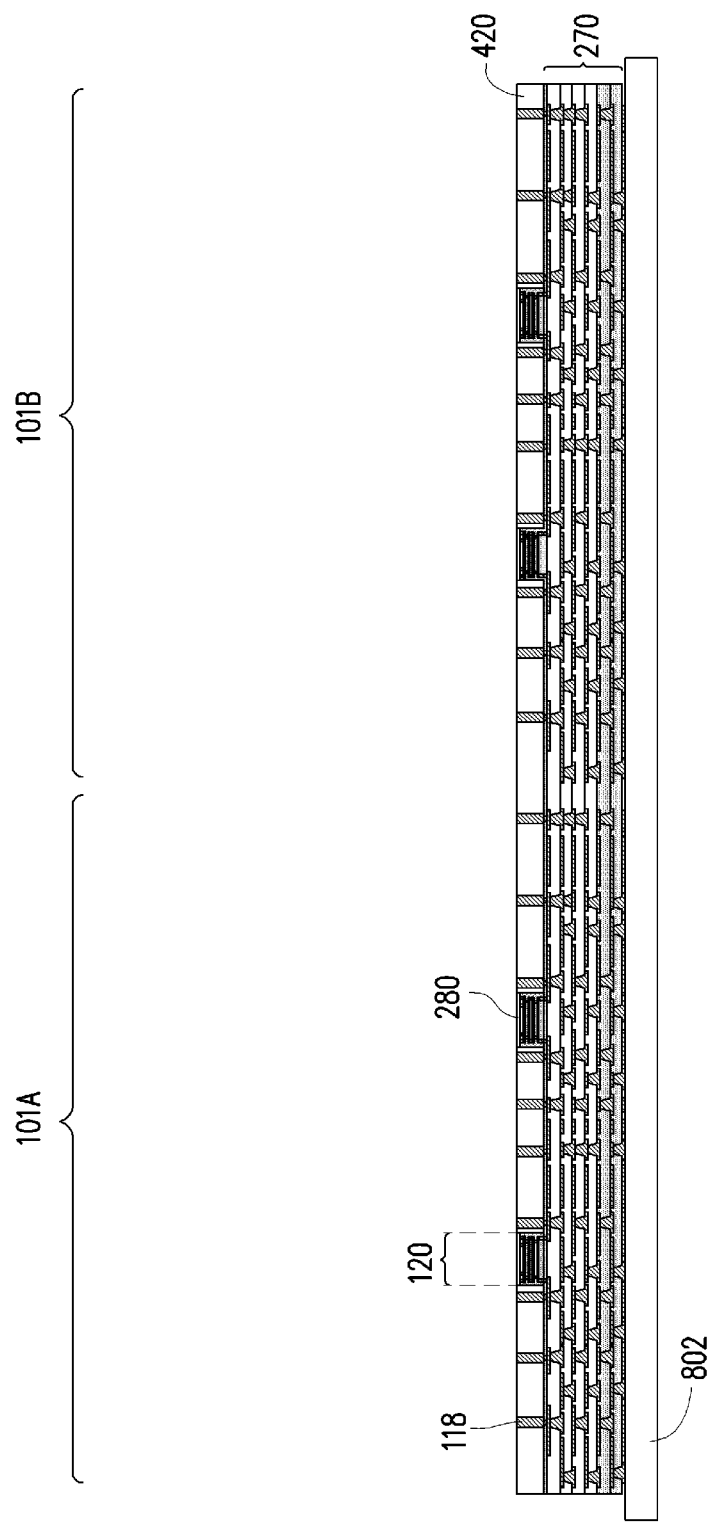

In FIG. 18, a carrier substrate de-bonding is performed to detach (or "de-bond") the carrier substrate 702 from the adhesive 280 on the local interconnect components 120, the encapsulant 420, and the through vias 118. In accordance with some embodiments, the de-bonding includes projecting a light such as a laser light or an UV light on the release layer (not illustrated) over the carrier substrate 702 so that the release layer decomposes under the heat of the light and the carrier substrate 702 can be removed. The structure is then flipped over and placed on another carrier substrate 802 and release layer (not illustrated).

Figure 19:
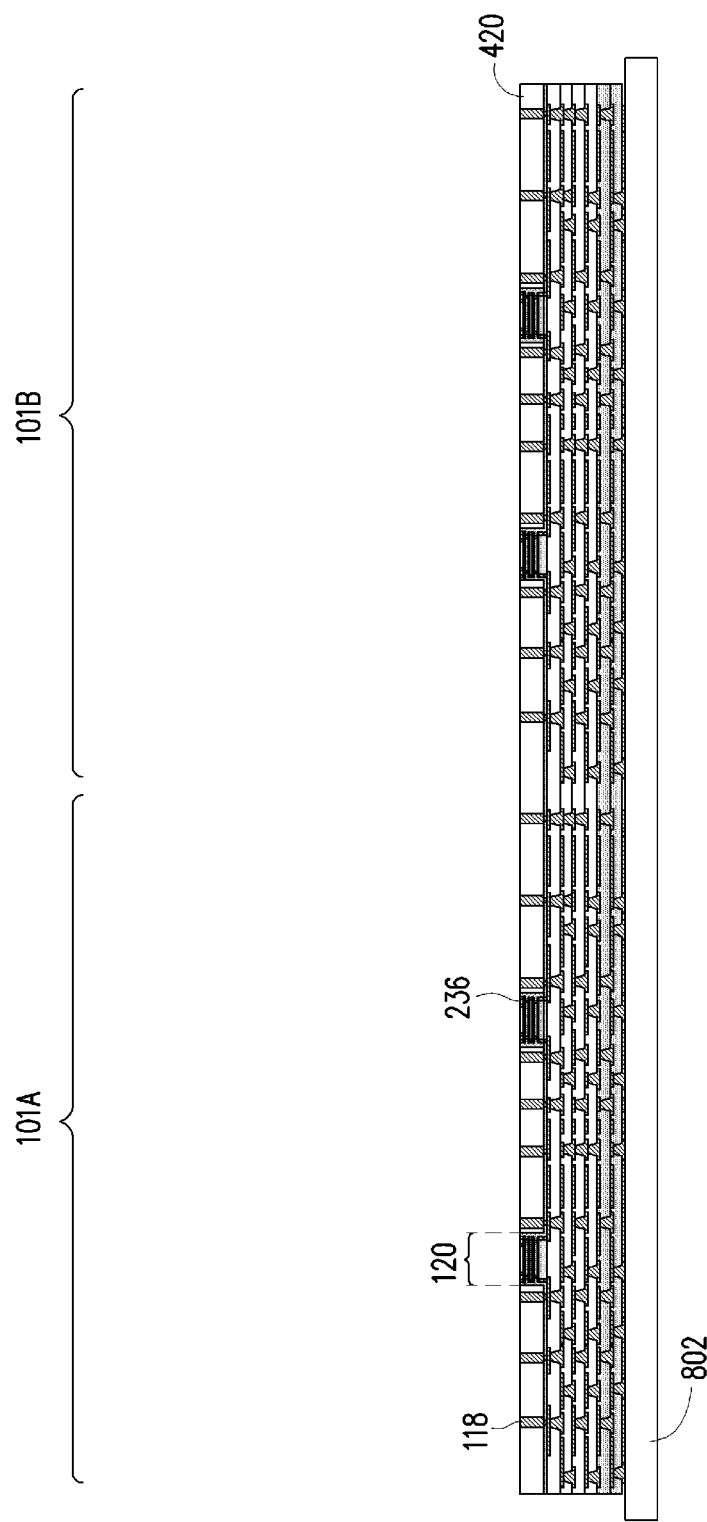

In FIG. 19, a planarization such as a grinding or a chemical mechanical polish is performed to remove the adhesive 280 (see FIG. 18), exposing top surfaces of the conductive connectors 236 of the local interconnect components 120. Exposing the top surfaces of the conductive connectors 236 may allow the conductive connectors 236 to be directly physically and electrically coupled to conductive features of a subsequently formed interconnect structure (see below, FIGS. 20A and 20B). Top portions of the encapsulant 420 and through vias 118 may also be removed. By not having a solder connection in the final structure, the electromigration issue of solder joints may be reduced. Higher reliability and improved electrical performance from low contact resistance may be at least in part due to a solder-free connection between the embedded double-sided local interconnect component and the redistribution structure. Using and then removing the adhesive 280 to attach the local interconnect components to the carrier substrate 702 may allow a solder joint attachment process including, e.g., formation of micro bumps on the local interconnect components and formation of micro bump pads on the carrier substrate for to be avoided, which may simplify process flow, increase throughput, and reduce crack formation caused by subsequent removal of the micro bumps and micro bump pads.

After the planarization, top surfaces of the conductive connectors 236 may be level with top surfaces of the encapsulant 420 and top surfaces of the through vias 118. The encapsulant 420 may have a thickness in a range of 5 μm to 150 μm after the planarization to remove the adhesive 280.

Figure 20A:
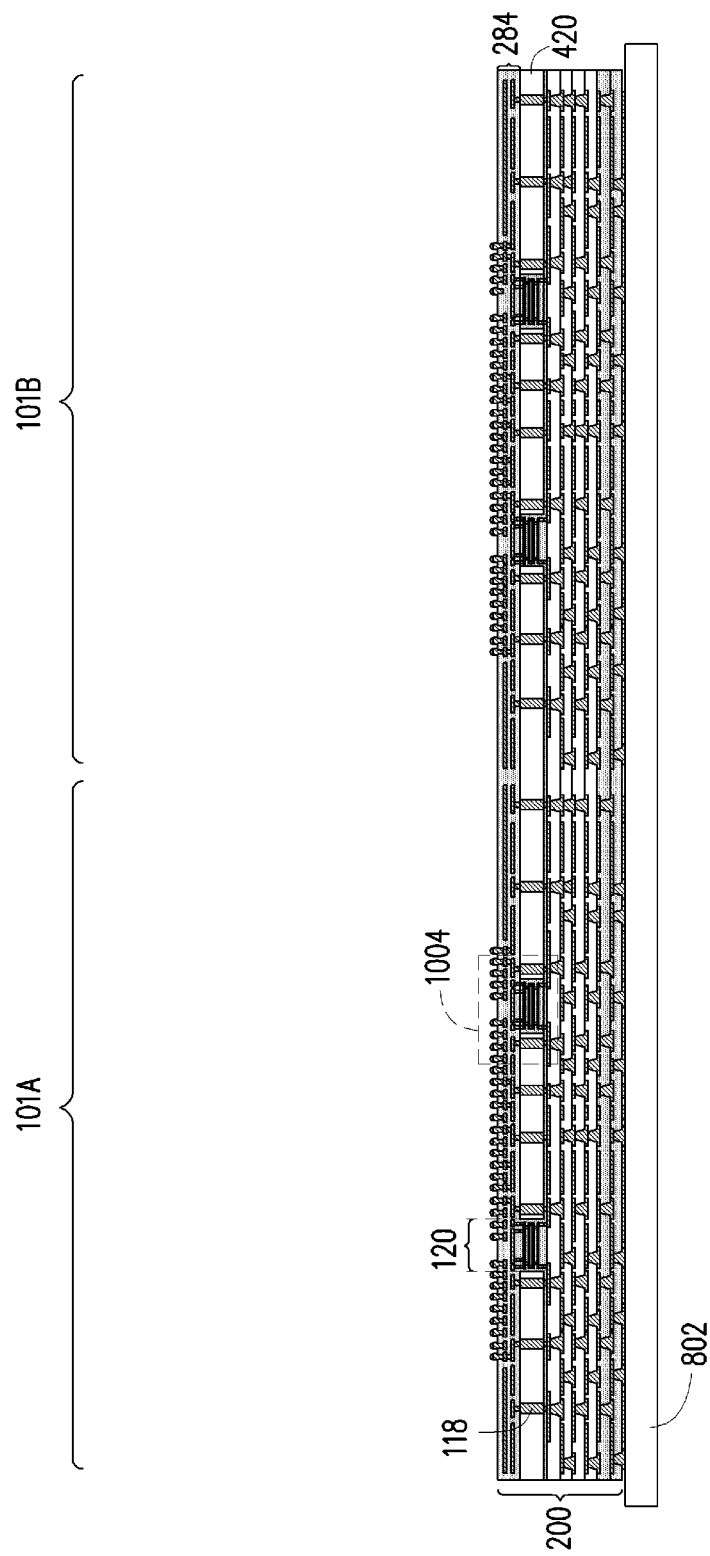
Figure 20B:
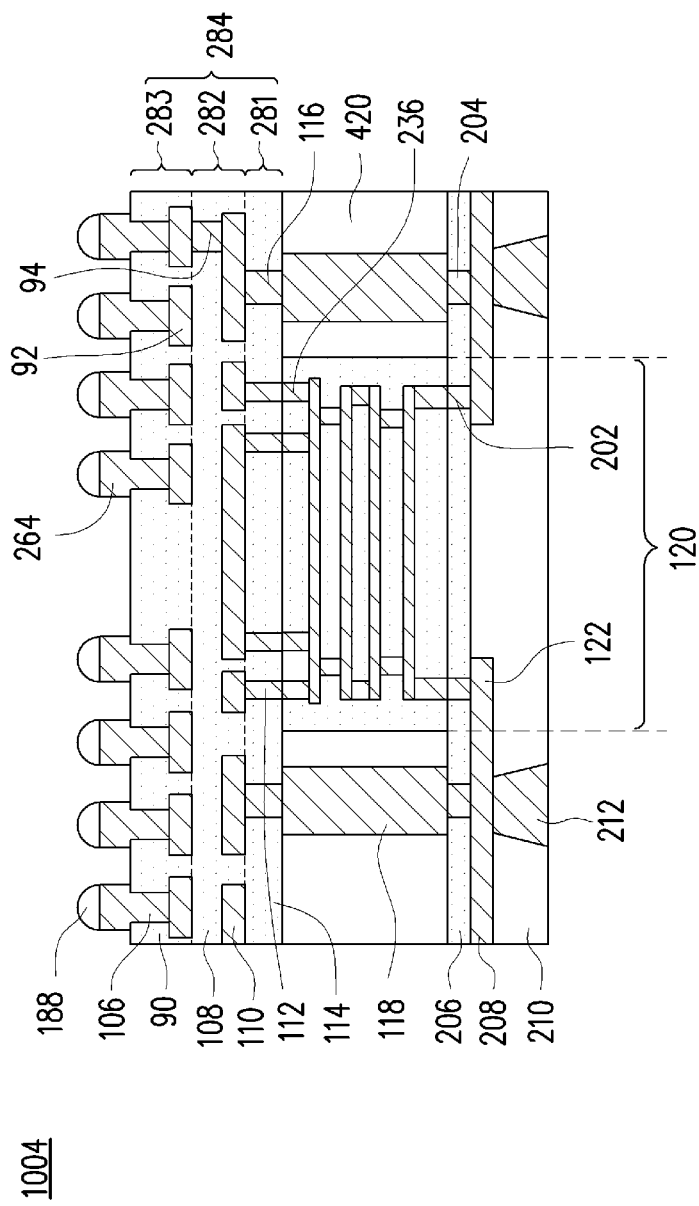

FIGS. 20A and 20B illustrate the redistribution structure 200 with an interconnect structure 284, also referred to as a redistribution structure 284, comprising redistribution layers 281, 282, and 283 being formed over the encapsulant 420, through vias 118, and local interconnect components 120. FIG. 20B illustrates a detailed cross-sectional view of region 1004 of FIG. 20A. Although the embodiments illustrated in accordance with FIGS. 20A and 20B show the interconnect structure 284 with three redistribution layers, any suitable number of redistribution layers may be formed, such as from zero to five redistribution layers. The redistribution layers 281, 282, and 283 may be used to couple the through vias 118 and local interconnect components 120 to subsequently attached components such as e.g. integrated circuit dies 512, 514, and 516. In embodiments with zero redistribution layers (not illustrated), under-bump metallizations (UBMs) 264 (see below) may be formed directly on and physically and electrically couple to the through vias 118 and the conductive connectors 236.

The redistribution layer 281 comprises a dielectric layer 114 and conductive vias 112 and 116 extending through the dielectric layer 114 to couple the conductive connectors 236 of the local interconnect components 120 and the through vias 118, respectively. The dielectric layer 114, conductive vias 112, and conductive vias 116 may be formed using similar methods and materials as the dielectric layer 206 and the conductive vias 202 and 204 (see above, FIGS. 17A and 17B). In some embodiments, the dielectric layer 114 comprises a polymer such as e.g. polyimide. In some embodiments, the dielectric layer 114 has a thickness in a range of 2 µm to 50 µm.

Redistribution layer 282 is formed over redistribution layer 281 and comprises a dielectric layer 108 and a metallization pattern comprising conductive lines 110 and conductive vias 94. The conductive lines 110 may be formed on and coupled to the conductive vias 112 and 116. The conductive lines 110 and conductive vias 94 may be formed using similar methods and materials as the conductive lines 208 and conductive vias 212 (see above, FIGS. 17A and 17B). The dielectric layer 108 may be formed using the same materials and methods as the dielectric layer 206.

Redistribution layer 283 is formed over redistribution layer 282 and comprises a dielectric layer 90 and a metallization pattern comprising conductive lines 92 and conductive vias 106. The conductive lines 92 may be formed on and coupled to the conductive vias 94. The conductive lines 92 and conductive vias 106 may be formed using similar methods and materials as the conductive lines 208 and conductive vias 212 (see above, FIGS. 17A and 17B). The dielectric layer 90 may be formed using the same materials and methods as the dielectric layer 206.

Still referring to FIGS. 20A and 20B, under-bump metallizations (UBMs) 264 (sometimes referred to as pads 264) are formed for external connection to conductive vias 106. The UBMs 264 have bump portions on and extending along the major surface of the dielectric layer 90, and may have via portions extending into the dielectric layer 90 to physically and electrically couple the conductive vias 106. As a result, the UBMs 264 are electrically coupled to the through vias 118 and the local interconnect components 120. The UBMs 264 may be formed of the same material as the conductive vias 106.

Further referring to FIGS. 20A and 20B, conductive connectors 188 are formed on the UBMs 264. The conductive connectors 188 allow for physical and electrical connection to dies such as e.g. integrated circuit dies 512, 514, and 516 or another package structure. The conductive connectors 188 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 188 may include a conductive material such as solder, copper, aluminum, gold, nickel, silver, palladium, tin, the like, or a combination thereof. In some embodiments, the conductive connectors 188 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 188 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, neighboring conductive connectors are separated by a pitch in a range of 20 µm to 80 µm.

Figure 21:
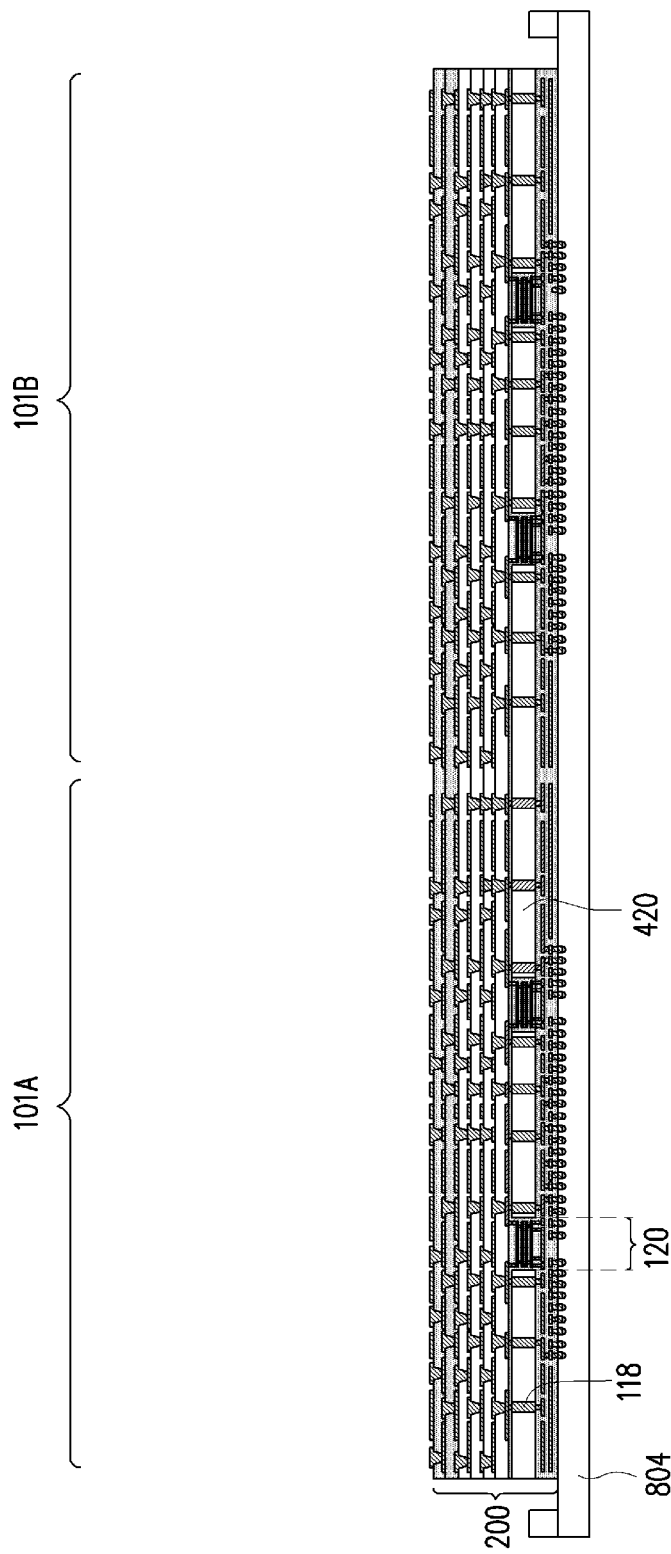

In FIG. 21, a carrier substrate de-bonding is performed to detach (or "de-bond") the carrier substrate 802 from the redistribution structure 200. In accordance with some embodiments, the de-bonding includes projecting a light such as a laser light or an UV light on the release layer (not illustrated) over the carrier substrate 802 so that the release layer decomposes under the heat of the light and the carrier substrate 802 can be removed. The structure is then flipped over and placed on another carrier 804, such as a tape.

Figure 22:
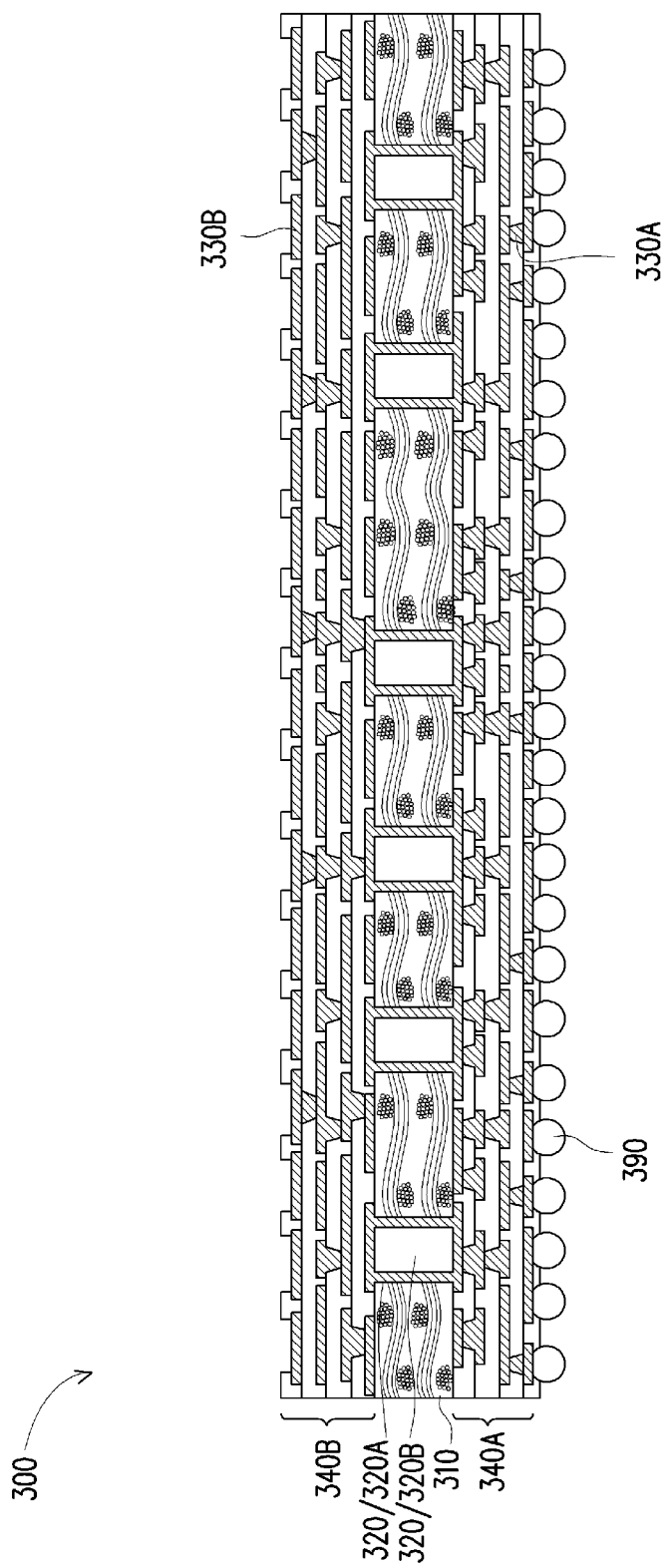

FIG. 22 illustrates a core substrate 300, which is subsequently bonded the redistribution structure 200 (see below, FIG. 23). Utilizing the core substrate 300 has the advantage of having the core substrate 300 being manufactured in a separate process. In addition, because core substrate 300 is formed in a separate process, it can be tested separately so that a known good core substrate 300 is used. For example, in some embodiments, the core substrate 300 may be individually or batch tested, validated, and/or verified prior to bonding the core substrate 300 to the redistribution structure 200.

The core substrate 300 may be, e.g., an organic substrate, a ceramic substrate, a silicon substrate, or the like. The conductive connectors 390 are used to attach the core substrate 300 to the redistribution structure 200. Attaching the core substrate 300 may include placing the core substrate 300 on the redistribution structure 200 and reflowing the conductive connectors 390 to physically and electrically couple the core substrate 300 and the redistribution structure 200.

Before being attached to the redistribution structure 200, the core substrate 300 may be processed according to applicable manufacturing processes to form redistribution structures in the core substrate 300. For example, the core substrate 300 includes a core 310. The core 310 may be formed of one or more layers of glass fiber, resin, filler, pre-preg, epoxy, silica filler, Ajinomoto Build-up Film (ABF), polyimide, molding compound, other materials, and/or combinations thereof. In some embodiments, for example, two layers are of material make up the core 310. The core 310 may be formed of organic and/or inorganic materials. In some embodiments, the core 310 includes one or more passive components (not shown) embedded inside. The core 310 may comprise other materials or components. Conductive vias 320 are formed extending through the core 310. The conductive vias 320 comprise a conductive material 320A such as copper, a copper alloy, or other conductors, and may include a barrier layer (not shown), liner (not shown), seed layer (not shown), and/or a fill material 320B, in some embodiments. The conductive vias 320 provide vertical electrical connections from one side of the core 310 to the other side of the core 310. For example, some of the conductive vias 320 are coupled between conductive features at one side of the core 310 and conductive features at an opposite side of the core 310. Holes for the conductive vias 320 may be formed using a drilling process, photolithography, a laser process, or other methods, as examples, and the holes of the conductive vias 320 are then filled or plated with conductive material. In some embodiments, the conductive vias 320 are hollow conductive through vias having centers that are filled with an insulating material. Redistribution structures 340A and 340B are formed on opposing sides of the core 310. The redistribution structures 340A and 340B are electrically coupled by the conductive vias 320, and fan-in/fan-out electrical signals.

The redistribution structures 340A and 340B each include dielectric layers, formed of ABF, pre-preg, or the like, and metallization patterns. Each respective metallization pattern has line portions on and extending along a major surface of a respective dielectric layer, and has via portions extending through the respective dielectric layer. The redistribution structures 340A and 340B each, respectively, include under-bump metallurgies (UBMs) 330A and 330B for external connection, and solder resists 350A and 350B protecting the features of the redistribution structures 340A and 340B. The redistribution structure 340A may subsequently be attached to the redistribution structure 200 by the UBMs 330A through the conductive connectors 390 as illustrated below in FIG. 23. More or fewer dielectric layers and metallization patterns may be formed in the redistribution structures 340A and 340B than shown in FIG. 22.

The core substrate 300 may include active and passive devices (not shown), or may be free from either active devices, passive devices, or both. A wide variety of devices such as transistors, capacitors, resistors, inductors, combinations of these, and the like may be used. The devices may be formed using any suitable methods.

Conductive connectors 390 may be used to bond the core substrates 300A and 300B to the redistribution structure 200 as illustrated below in FIG. 23. Conductive connectors 390 may be first formed on either the core substrates 300A and 300B, or on the conductive pads 214 of the redistribution structure 200 (see above, FIG. 21), and then reflowed to complete the bond. For example, in the embodiment shown in FIG. 22, conductive connectors 390 are formed on UBMs 330A of the bottom redistribution structure 340A with a pitch in a range of 20 µm to 500 µm. The conductive connectors 390 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 390 may include a conductive material such as solder, copper, aluminum, gold, nickel, silver, palladium, tin, the like, or a combination thereof. Integration of such conductive connectors 390 may provide flexibility in placement for semiconductor devices, such as integrated passive device (IPD) chips, integrated voltage regulators (IVRs), active chips, among other electrical components, to implement system-on-a-chip type of package components, thus reducing fabrication complexity. Such embodiments may also provide a greater amount of flexibility for various other package configurations as well.

In some embodiments, the conductive connectors 390 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 390 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 23:
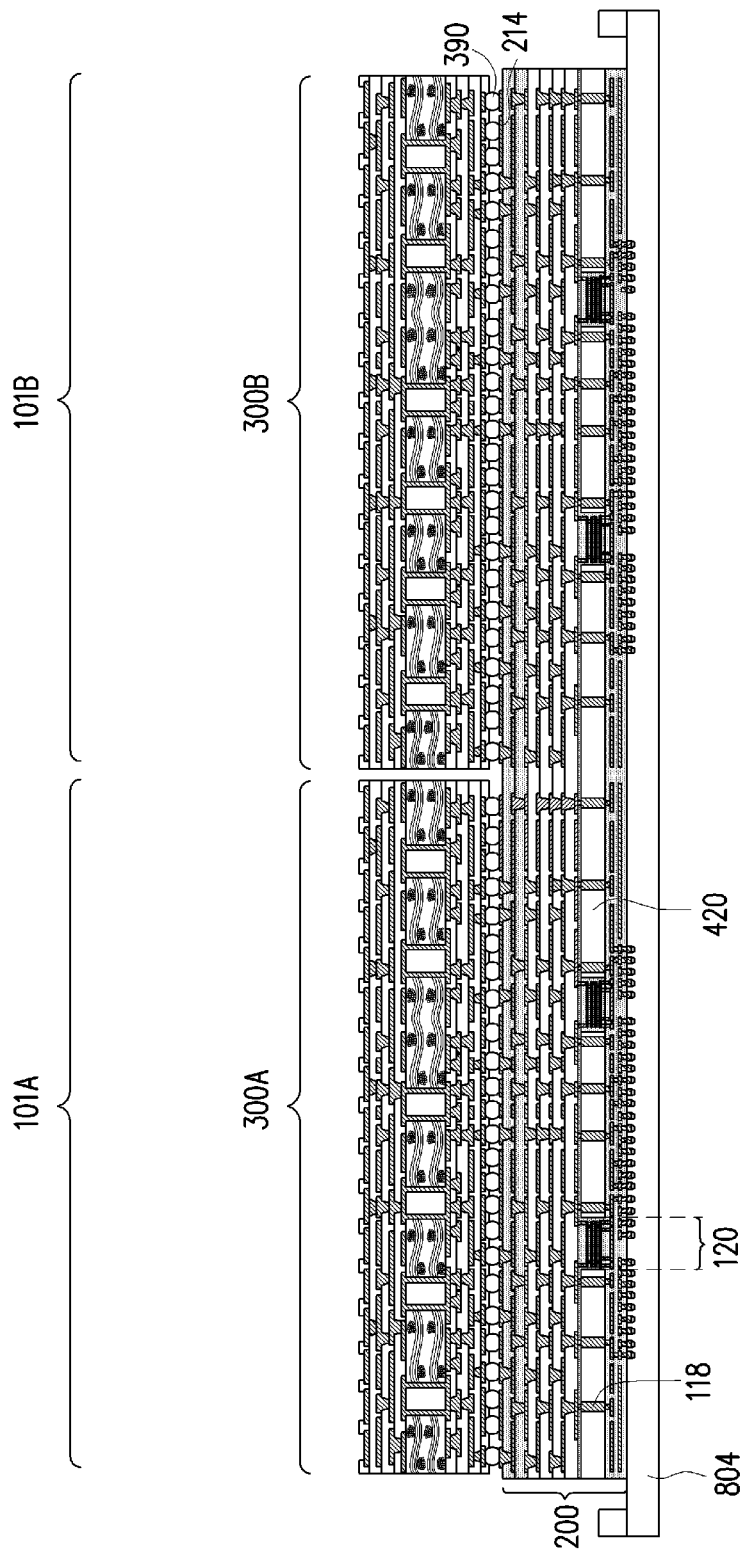

In FIG. 23, core substrates 300A and 300B are bonded to the redistribution structure 200 (see above, FIG. 21) in first package region 101A and second package region 101B, respectively. In some embodiments, the core substrates 300A and 300B may be placed on the redistribution structure 200 using a pick and place process or another suitable process and the conductive connectors 390 bonded by flip chip bonding process or other suitable bonding process. In some embodiments, the conductive connectors 390 are reflowed to attach the core substrates 300A and 300B to the redistribution structure 200 by way of conductive pads 214. The conductive connectors 390 electrically and/or physically couple the core substrates 300A and 300B to the redistribution structure 200 and through the local interconnect components 120 to integrated circuit dies 512, 514, and 516. The double-sided connection of the integrated circuit dies 512, 514, and 516 to each other and to the core substrate 300 through the local interconnect component 120 may increase the communication bandwidth between the integrated circuit dies while maintaining low contact resistance and high reliability The conductive connectors 390 may have an epoxy flux (not shown) formed thereon before they are reflowed with at least some of the epoxy portion of the epoxy flux remaining after the core substrates 300A and 300B are attached to the redistribution structure 200.

Figure 24:
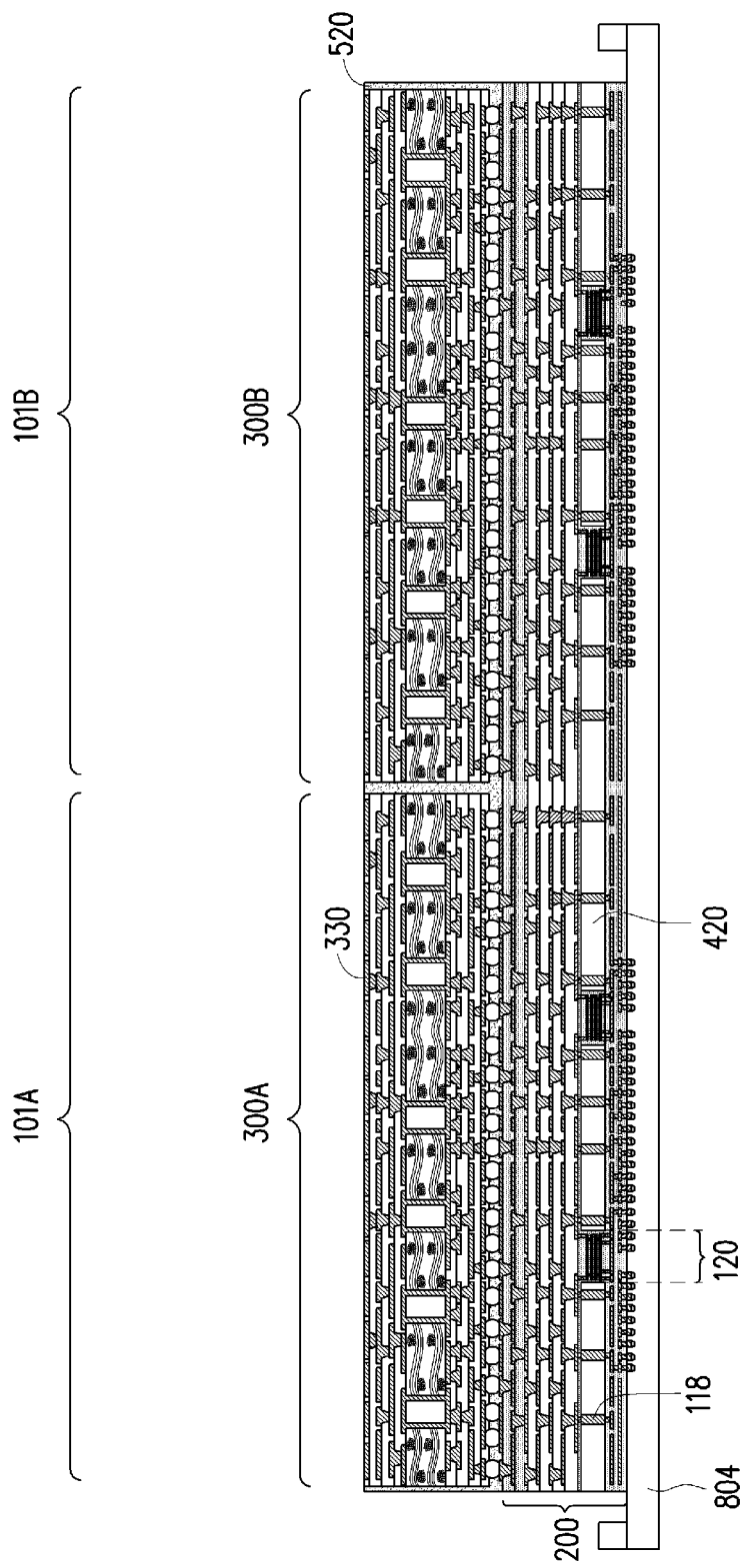

In FIG. 24, an encapsulation is performed by forming encapsulant 520 on and around the various components. After formation, the encapsulant 520 surrounds the core substrates 300A and 300B, including conductive connectors 390, metallization pattern 174, and the upper exposed surface of dielectric layer 172. The encapsulant 520 may be formed of or including a molding compound, epoxy, an underfill, a molding underfill, the like, or a combination thereof and may be applied by compression molding, transfer molding, or the like. The encapsulant 520 may be applied in liquid or semi-liquid form and then subsequently cured. The encapsulant 520 may be formed over the frame 190 such that core substrates 300A and 300B are buried or covered.

Further referring to FIG. 24, a planarization process may be performed, if necessary, on the encapsulant 520 to expose the UBMs 330 of the core substrates 300A and 300B. Topmost surfaces of the encapsulant 520 and UBMs 330 are level (e.g., planar) after the planarization process within process variations. The planarization process may be, for example, a chemical-mechanical polish (CMP), a grinding process, or the like. In some embodiments, the planarization may be omitted, for example, if the UBMs 330 are already exposed. Other processes may be used to achieve a similar result. For example, a dielectric or passivation layer may be formed over UBMs 330 prior to forming the encapsulant 520. In such cases, the dielectric or passivation layer may be patterned in a subsequent step to expose portions of the UBMs 330.

As discussed above, the redistribution structure 200 may be larger and include multiple package regions, such as the first package region 101A and second package region 101B.

Figure 25:
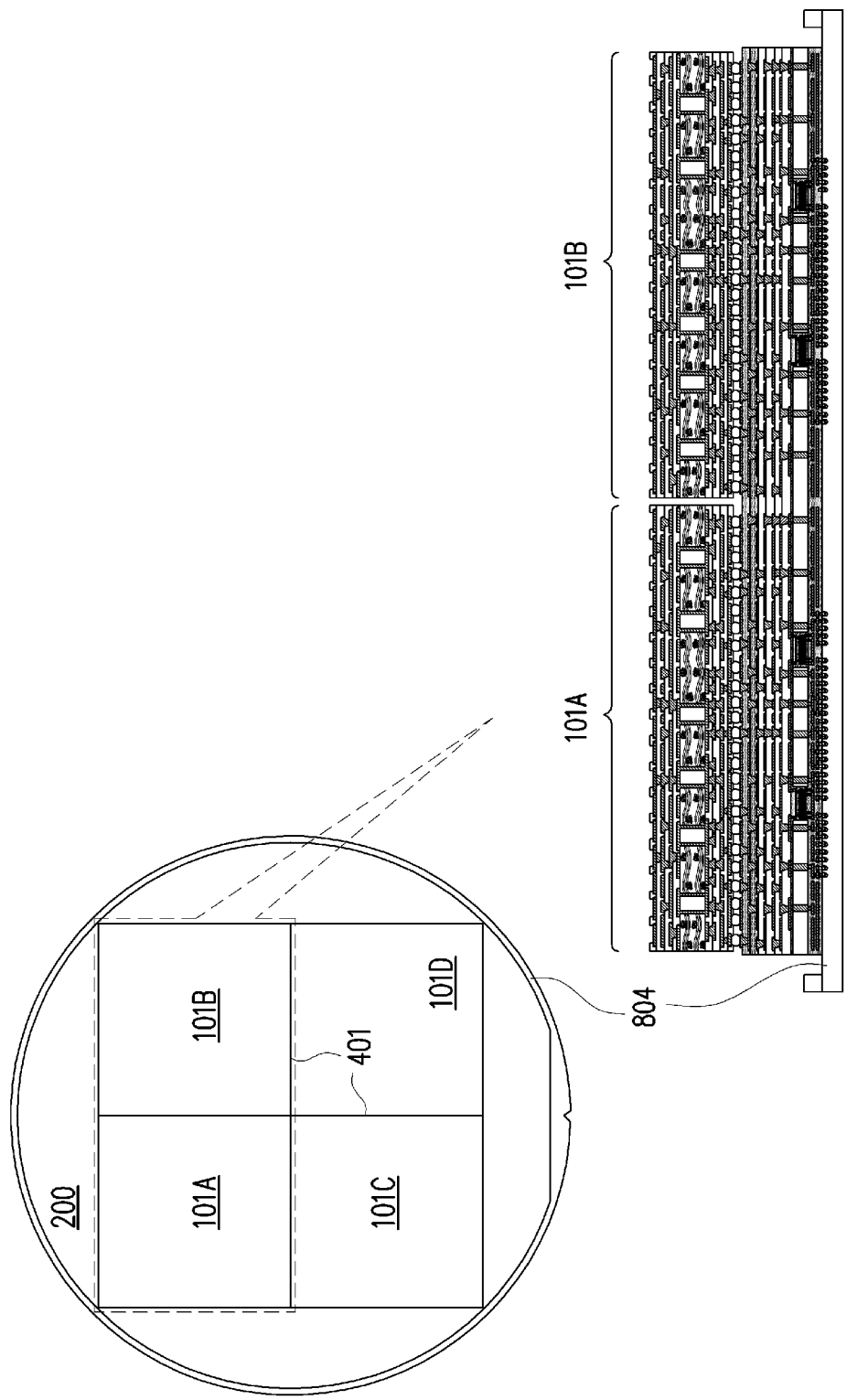
FIG. 25 illustrates a planar view of the layout of package regions on a wafer substrate in accordance with some embodiments.

For example, FIG. 25 illustrates the redistribution structure 200 as illustrated above in FIG. 20A having a circular wafer shape with multiple package regions. In the embodiment shown, four package regions 101A, 101B, 101C, and 101D are included on the wafer allowing for four final package components to be fabricated on a single wafer and later singulated. Fewer or more package regions may be utilized on a single wafer in other embodiments. Subsequent steps in the process use the redistribution structure 200 on a carrier substrate 802 as the base upon which to continue the fabrication process described in further detail below. As described in further detail below, the individual package regions are singulated by sawing along lines 401 and around the outer edges of package regions 101A, 101B, 101C, and 101D.

Figure 26:
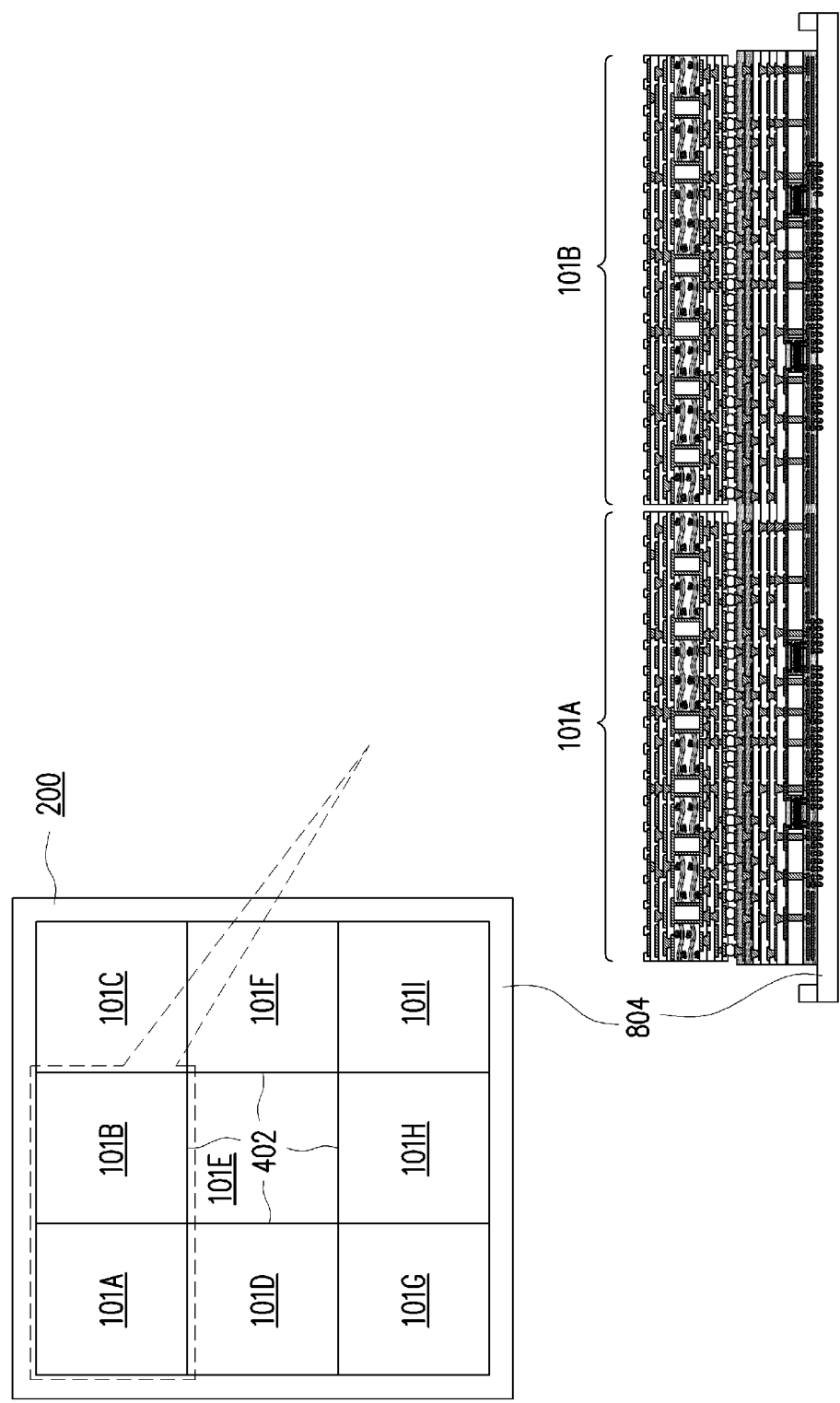
FIG. 26 illustrates a planar view of the layout of package regions on a panel substrate in accordance with some embodiments.

FIG. 26 illustrates the redistribution structure 200 being manufactured using a panel form fabrication process with multiple package regions. In the embodiment shown, nine package regions 101A through 101I are included on the wafer allowing for nine final package components to be fabricated on a single wafer or panel. Fewer or more package regions may be utilized on a single wafer or panel in other embodiments. Subsequent steps in the process use the redistribution structure 200 on a carrier substrate 802 as the base upon which to continue the fabrication process described in further detail below. As described in further detail below, the individual package regions are singulated by sawing along lines 402 and around the perimeter of package regions 101A through 101I.

Figure 27:
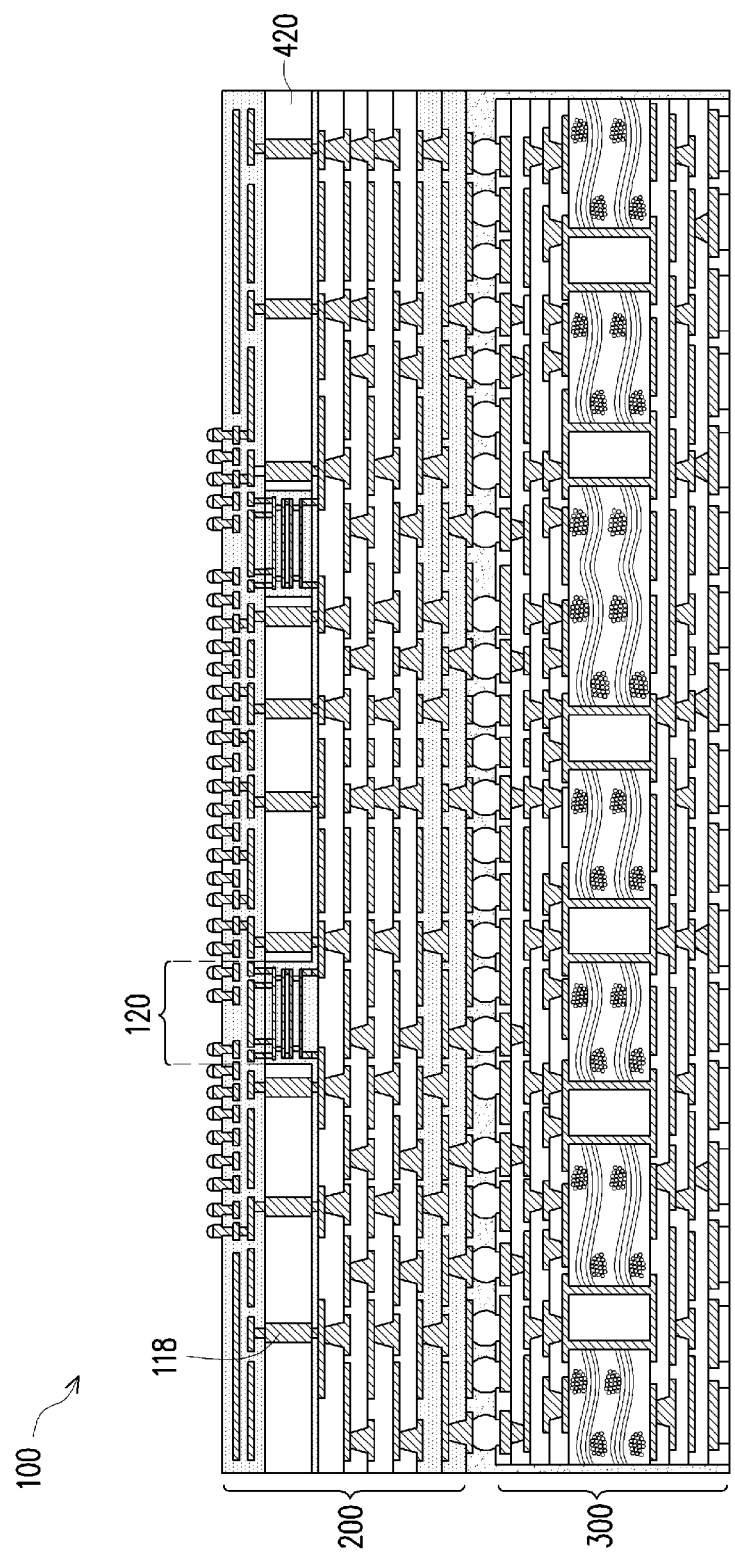

In FIG. 27, a singulation process is performed by sawing along scribe line regions, e.g., between the first package region 101A and the second package region 101B. The sawing singulates the first package region 101A from adjacent package regions to form multiple singulated package components 100. As illustrated in FIG. 24, sidewalls of the core substrate 300 are covered with the encapsulant 520, thereby protecting the sidewalls of the core substrates 300A and 300B during and after singulation.

Figure 28:
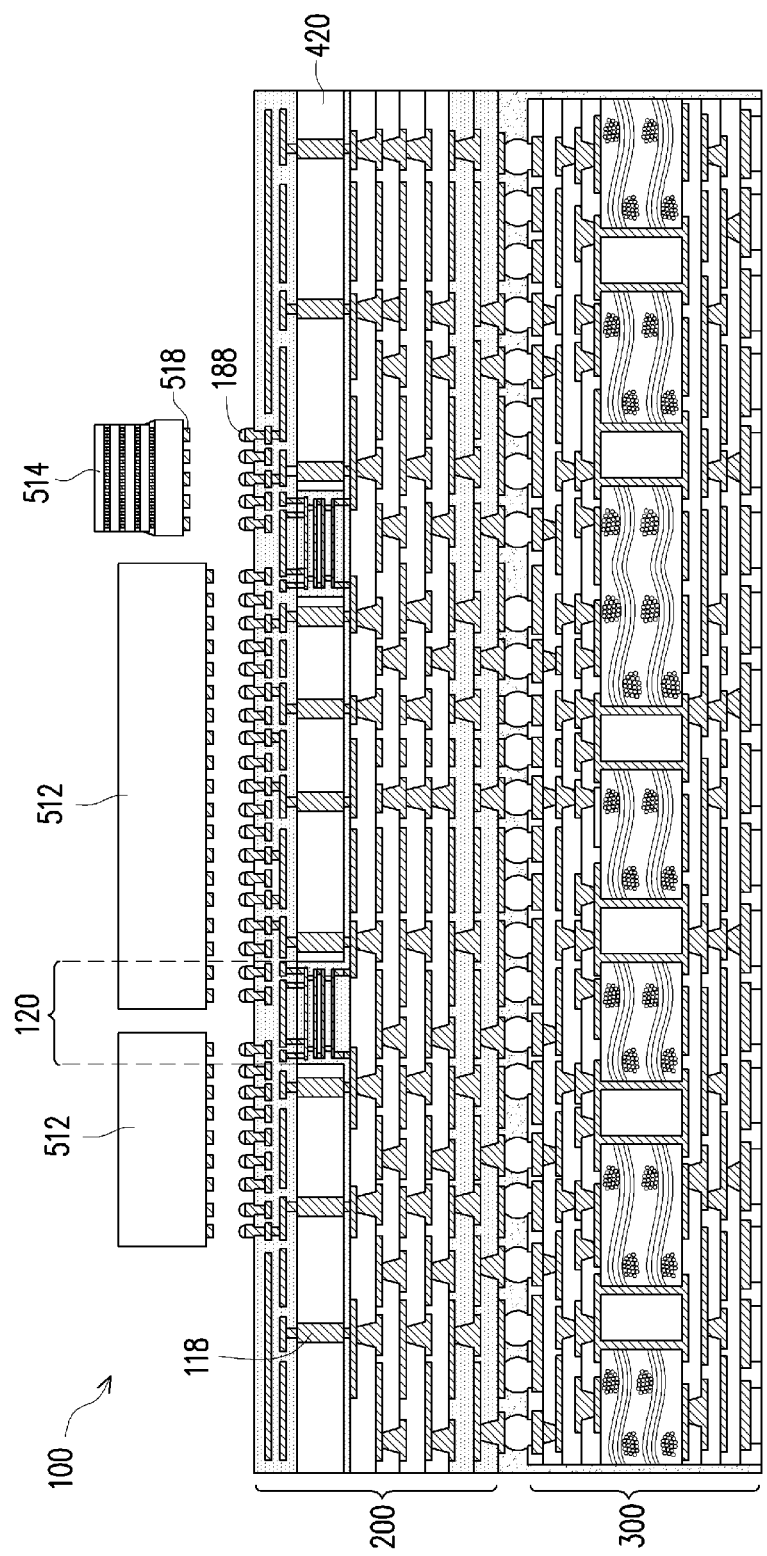

In FIG. 28, a plurality of integrated circuit dies such as one or more logic dies 512, one or more memory dies 514, and one or more input/output (I/O) dies 516 (not shown in FIG. 23, but see FIG. 3) are attached to the redistribution structure 200. The dies 512, 514, and 516 have bond pads 518 that are bonded to the conductive connectors 188. In some embodiments, the bond pads 518 are made of a conductive material and may be similar to the conductive lines (see, e.g., conductive lines 110) described above. In some embodiments, the dies 512, 514, and 516 may be placed on the redistribution structure 200 using a pick and place process or another suitable process and the conductive connectors 188 bonded by flip chip bonding process or other suitable bonding process. In some embodiments, the conductive connectors 188 are reflowed to attach the dies 512, 514, and 516 to the redistribution structure 200 by way of the bond pads 518. The dies 512, 514, and 516 may be coupled to the redistribution structure 200 such that neighboring dies 512, 514, and 516 are coupled to each other through local interconnect components 120 (see above, FIG. 3). The local interconnect components 120 provide electrical routing and connection between the integrated circuit dies 512, 514, and 516 of the integrated circuit package 500 and increase the communication bandwidth between the integrated circuit dies 512-516 while maintaining low contact resistance and high reliability.

Figure 29:
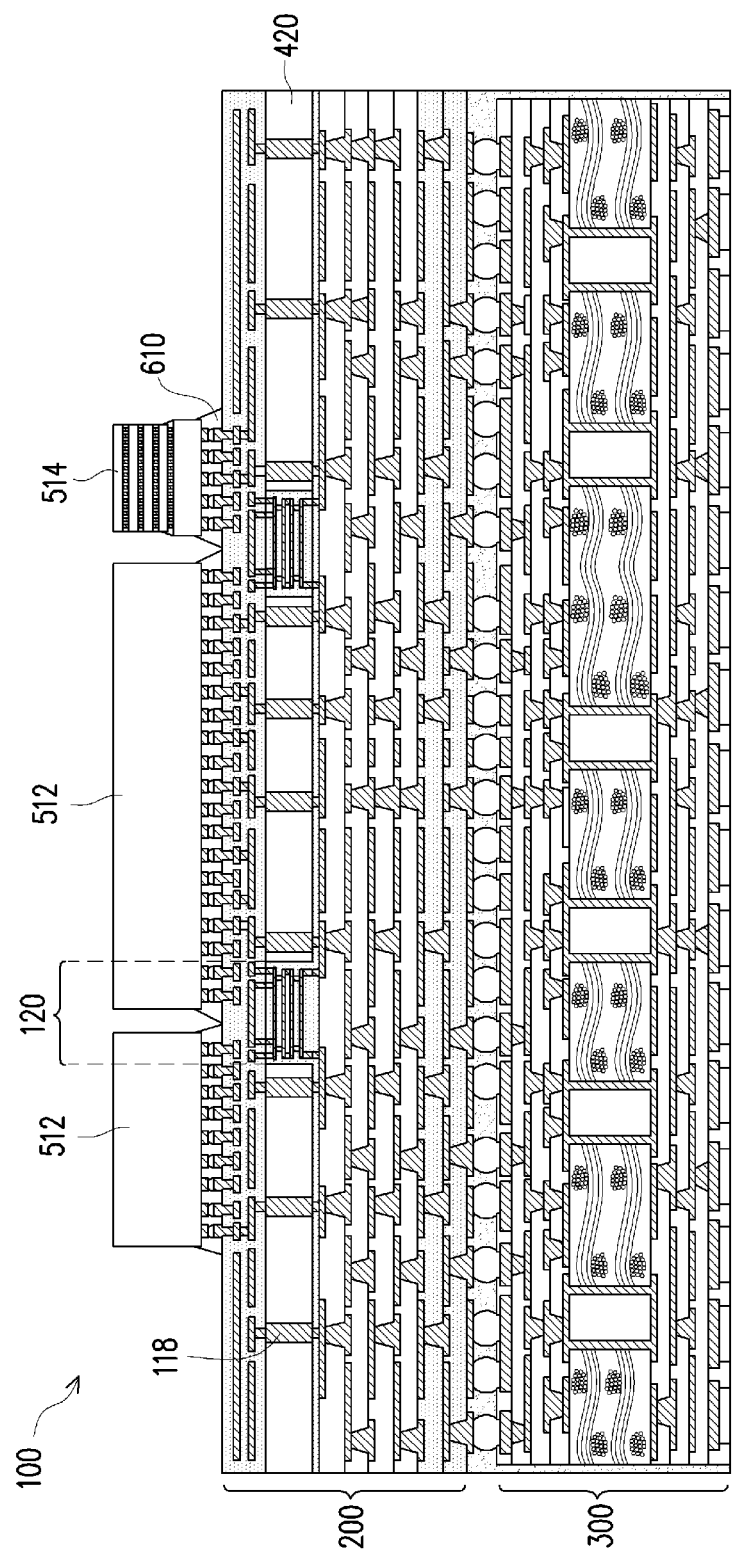

FIG. 29 illustrates an underfill 610, as shown in FIG. 1, may be formed surrounding the conductive connectors 188 between the integrated circuit dies 512, 514, and 516 and the redistribution structure 200. The underfill 610 may reduce stress and protect the joints resulting from the reflowing of the conductive connectors 188. The underfill 610 may be formed by a capillary flow process after the integrated circuit package 500 is attached, or may be formed by a suitable deposition method. In some embodiments, a single layer of underfill 610 is formed beneath multiple adjacent devices, and further subsequent underfills (not shown) or encapsulants (not shown) may be formed beneath and/or around additional devices placed on top of the singulated package component 100.

Figure 30:
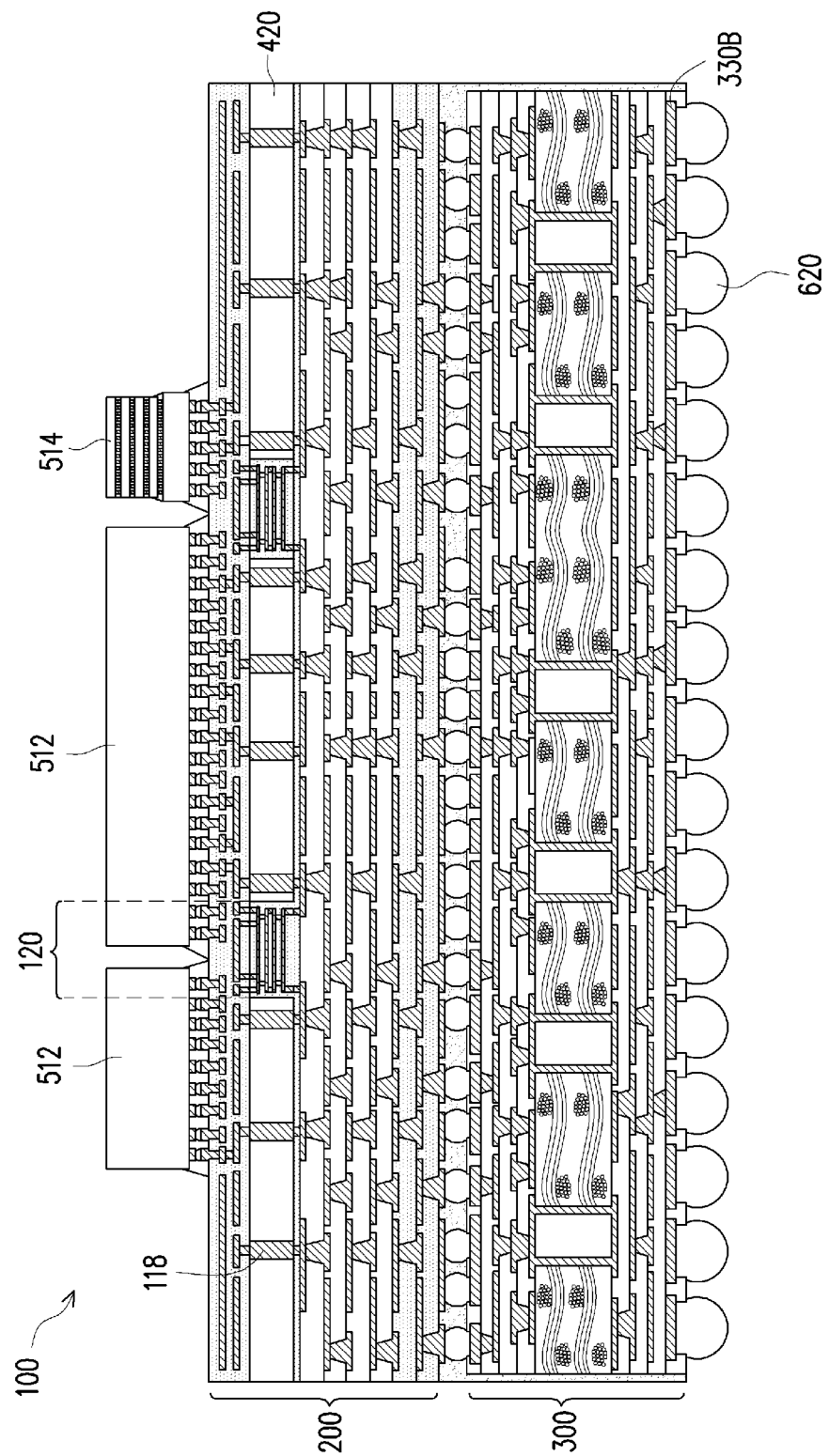

FIG. 30 illustrates external connectors 620 formed on the UBMs 330B of the core substrate 300. The external connectors 620 may be ball grid array (BGA) connectors, solder balls, metal pillars, controlled collapse chip connection (C4) bumps, micro bumps, or the like. The external connectors 620 may include a conductive material such as solder, copper, aluminum, gold, nickel, silver, palladium, tin, the like, or a combination thereof. In some embodiments, the external connectors 620 are formed by initially forming a layer of reflowable material on the UBMs 330 through evaporation, electroplating, printing, solder transfer, ball placement, or the like. Once a layer of reflowable material has been formed on the UBMs 330B a reflow may be performed in order to shape the material into the desired bump shapes.

Embodiments may achieve advantages. For example, embedded double-sided local interconnect component may increase the communication bandwidth between the integrated circuit dies while maintaining low contact resistance and high reliability. Communication bandwidth may be increased between the integrated circuit dies and other attached packages such as e.g. core substrates through the embedded double-sided local interconnect component, which may be useful for high performance computing. Attaching the local interconnect components to a carrier substrate using an adhesive such as e.g. a die attach film (DAF) during fabrication of the package component may allow the avoiding of a solder joint attachment process including, e.g. formation of micro bumps on the local interconnect components and formation of micro bump pads on the carrier substrate. This may simplify process flow, increase throughput, and reduce crack formation caused by subsequent removal of the micro bumps and micro bump pads. A solder-free connection between the embedded double-sided local interconnect component and the redistribution structure may contribute to higher reliability and improved electrical performance and may reduce the electromigration issue of solder joints. An interposer is not required between the integrated circuit dies and the redistribution structure due to the increased communication bandwidth between the integrated circuit dies provided by the double-sided local interconnect components. Chip package interaction issues may be reduced and the reliability window may be widened by removing the need for an interposer. This may reduce the coefficient of thermal expansion (CTE) mismatch between the integrated circuit package (including the integrated circuit dies) and the core substrate package (including the core substrate and the redistribution structure), which may reduce the warpage mismatch.

In accordance with an embodiment, a method of forming a semiconductor device, the method including: forming a first through via and a second through via on a first substrate; attaching a first local interconnect component to the first substrate, the first local interconnect component being disposed between the first through via and the second through via, the first local interconnect component being attached to the first substrate with a first adhesive; encapsulating the first local interconnect component, the first through via, and the second through via with a first encapsulant; removing a top portion of the first encapsulant and a top portion of the first local interconnect component; forming a first redistribution structure over a first side of the first local interconnect component, the first through via, the second through via, and the first encapsulant; removing the first local interconnect component, the first encapsulant, the first through via, the second through via, and the first redistribution structure from the first substrate and attaching the first redistribution structure to a second substrate; removing the first adhesive from the first local interconnect component; and forming an interconnect structure over a second side of the first local interconnect component, the first through via, the second through via, and the first encapsulant, the second side being opposite the first side, a first conductive feature of the interconnect structure being physically and electrically coupled to a second conductive feature of the first local interconnect component. In an embodiment, the first adhesive has a thickness in a range of 5 μm to 100 μm. In an embodiment, removing the first adhesive includes a grinding process. In an embodiment, removing the top portion of the first local interconnect component includes removing a portion of a substrate. In an embodiment, the method further includes attaching a first integrated circuit die to the interconnect structure and attaching a second integrated circuit die to the interconnect structure, wherein the first integrated circuit die is coupled to the second integrated circuit die through the first local interconnect component. In an embodiment, the method further includes: attaching a second local interconnect component to the first substrate with a second adhesive; encapsulating the second local interconnect component with the first encapsulant; removing a top portion of the second local interconnect component; forming the first redistribution structure over the second local interconnect component; removing the second local interconnect component from the first substrate; removing the second adhesive from the second local interconnect component; and forming the interconnect structure over the second local interconnect component, a third conductive feature of the interconnect structure being physically and electrically coupled to a fourth conductive feature of the second local interconnect component. In an embodiment, the method further includes attaching a third integrated circuit die to the interconnect structure, wherein the first integrated circuit die is coupled to the third integrated circuit die through the second local interconnect component. In an embodiment, the first integrated circuit die is a logic die, the second integrated circuit die is a logic die, and the third integrated circuit die is a memory die. In an embodiment, the first integrated circuit die is a logic die. In an embodiment, the second integrated circuit die is a memory die and the third integrated circuit die is a memory die. In an embodiment, the second integrated circuit die is a logic die and the third integrated circuit die is an input/output die.

In accordance with another embodiment, a method of forming a semiconductor device includes: forming a first plurality of redistribution layers on a first substrate, the first plurality of redistribution layers including a first plurality of conductive pads, the first plurality of conductive pads exposed on a top surface of the first plurality of redistribution layers; forming an adhesive over the first plurality of redistribution layers; singulating the first substrate, the first plurality of redistribution layers, and the adhesive into a plurality of local interconnect components, a first local interconnect component of the plurality of local interconnect components including: a singulated portion of the first substrate; a singulated portion of the first plurality of redistribution layers on the singulated portion of the first substrate; a first conductive pad of the first plurality of conductive pads and a second conductive pad of the first plurality of conductive pads extending to a top surface of the singulated portion of the first plurality of redistribution layers; and a singulated portion of the adhesive covering the singulated portion of the first plurality of redistribution layers; attaching the first local interconnect component to a second substrate; encapsulating the first local interconnect component with a first encapsulant; removing a top portion of the first encapsulant and removing the singulated portion of the first substrate from the first local interconnect component; forming a first redistribution structure over a first side of the first local interconnect component and the first encapsulant; removing the first local interconnect component, the first encapsulant, and the first redistribution structure from the second substrate and attaching the first redistribution structure to a third substrate; removing the singulated portion of the adhesive to expose the first conductive pad and the second conductive pad; and forming a second redistribution structure over a second side of the first local interconnect component and the first encapsulant, the second side being opposite the first side, the second redistribution structure including a third conductive pad and a fourth conductive pad, the third conductive pad being bonded to the first conductive pad, the fourth conductive pad being bonded to the second conductive pad. In an embodiment, the first plurality of redistribution layers includes polyimide. In an embodiment, the first plurality of redistribution layers includes a molding film. In an embodiment, the method further includes attaching a first integrated circuit die to the second redistribution structure, attaching a second integrated circuit die to the second redistribution structure, and attaching a core substrate to the first redistribution structure, the first integrated circuit die being electrically coupled to the second integrated circuit die through the first local interconnect component, and the core substrate being electrically coupled to the first integrated circuit die through the first local interconnect component.

In accordance with yet another embodiment, a semiconductor structure includes: a first redistribution structure, the first redistribution structure including a first dielectric layer and a first plurality of conductive features; a local interconnect component disposed on the first redistribution structure, sidewalls of the local interconnect component being surrounded by an underfill, the local interconnect component including a first plurality of redistribution layers, the first plurality of redistribution layers including: a second plurality of conductive features on a first side of the local interconnect component, the first side physically contacting the first redistribution structure, each of the first plurality of conductive features being physically and electrically coupled to respective conductive features of the second plurality of conductive features; and a third plurality of conductive features and a fourth plurality of conductive features, the third plurality of conductive features and the fourth plurality of conductive features being on a second side of the local interconnect component opposite the first side; and a first interconnect structure over a second side of the local interconnect component, the second side being opposite the first side, the first interconnect structure including a fifth plurality of conductive features and a sixth plurality of conductive features, each conductive feature of the third plurality of conductive features being bonded to a respective conductive feature of the fifth plurality of conductive features, each conductive feature of the fourth plurality of conductive features being bonded to a respective conductive feature of the sixth plurality of conductive features. In an embodiment, the semiconductor structure further includes: a first integrated circuit die physically and electrically coupled to the first interconnect structure opposite the local interconnect component, the first integrated circuit die being electrically coupled to the fifth plurality of conductive features of the first interconnect structure; and a second integrated circuit die physically and electrically coupled to the first interconnect structure opposite the local interconnect component, the second integrated circuit die being adjacent to the first integrated circuit die, the second integrated circuit die being electrically coupled to the sixth plurality of conductive features of the first interconnect structure. In an embodiment, the semiconductor structure further includes a semiconductor package attached to the first redistribution structure opposite the local interconnect component, the semiconductor package being coupled to the first integrated circuit die through the local interconnect component. In an embodiment, the semiconductor package is a core substrate. In an embodiment, the semiconductor structure further includes: a plurality of through vias extending through the underfill, a bottom surface of each through via of the plurality of through vias being coupled to a respective conductive feature of the first redistribution structure, a top surface of each through via of the plurality of through vias being coupled to a respective conductive feature of the first interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a core substrate comprising a core layer, at least one first build-up layer on a first side of the core layer, and at least one second build-up layer on a second side of the core layer opposite the first side, the core substrate having a first outermost sidewall and a second outermost sidewall;
an encapsulant surrounding the first outermost sidewall and the second outermost sidewall, respectively, the encapsulant having a third outermost sidewall adjacent the first outermost sidewall and having a fourth outermost sidewall adjacent the second outermost sidewall;
a first redistribution structure comprising a first dielectric layer and a first plurality of conductive features, the first redistribution structure being separate from and electrically connected to the core substrate by a plurality of external connection joints, wherein the first redistribution structure has a fifth outermost sidewall that extends laterally beyond the first outermost sidewall of the core substrate and that is co-linear with the third outermost sidewall of the encapsulant, and further has a sixth outermost sidewall that extends laterally beyond the second outermost sidewall of the core substrate and that is co-linear with the fourth outermost sidewall of the encapsulant;
a local interconnect component disposed on the first redistribution structure, sidewalls of the local interconnect component being surrounded by an underfill, the local interconnect component being spaced apart from the core substrate by the first redistribution structure, the local interconnect component comprising:
a second plurality of conductive features on a first side of the local interconnect component, the first side physically contacting the first redistribution structure, each of the first plurality of conductive features being physically and electrically coupled to respective conductive features of the second plurality of conductive features; and
a third plurality of conductive features and a fourth plurality of conductive features, the third plurality of conductive features and the fourth plurality of conductive features being on a second side of the local interconnect component opposite the first side; and
a first interconnect structure over the second side of the local interconnect component, the first interconnect structure comprising a fifth plurality of conductive features and a sixth plurality of conductive features, each conductive feature of the third plurality of conductive features being bonded to a respective conductive feature of the fifth plurality of conductive features, each conductive feature of the fourth plurality of conductive features being bonded to a respective conductive feature of the sixth plurality of conductive features.

2. The semiconductor structure of claim 1, further comprising:
a first integrated circuit die physically and electrically coupled to the first interconnect structure opposite the local interconnect component, the first integrated circuit die being electrically coupled to the fifth plurality of conductive features of the first interconnect structure; and
a second integrated circuit die physically and electrically coupled to the first interconnect structure opposite the local interconnect component, the second integrated circuit die being adjacent to the first integrated circuit die, the second integrated circuit die being electrically coupled to the sixth plurality of conductive features of the first interconnect structure.

3. The semiconductor structure of claim 1, wherein the external connection joints comprise solder joints.

4. The semiconductor structure of claim 1, wherein the encapsulant extends over a topmost surface of the core substrate and surrounds the external connection joints.

5. The semiconductor structure of claim 1, further comprising a plurality of through vias extending through the underfill, a bottom surface of each through via of the plurality of through vias being coupled to a respective conductive feature of the first redistribution structure, a top surface of each through via of the plurality of through vias being coupled to a respective conductive feature of the first interconnect structure.

6. The semiconductor structure of claim 1, wherein the local interconnect component is a die free of any semiconductor substrate.

7. The semiconductor structure of claim 1, wherein each conductive feature of the third plurality of conductive features has a same width as each conductive feature of the fifth plurality of conductive features.

8. A semiconductor device comprising:
a first redistribution structure comprising first vias embedded in a first dielectric layer;
a local interconnect comprising:
   second vias on a first side of the local interconnect, wherein the second vias are electrically and physically coupled to the first vias; and
   third vias on a second side of the local interconnect opposite the first side of the local interconnect;
a molding compound surrounding the local interconnect, wherein the molding compound is a separate material from the first dielectric layer and extends over a topmost surface of the first dielectric layer;
a second redistribution structure comprising fourth vias adjacent to the second side of the local interconnect, wherein the fourth vias are electrically and physically coupled to the third vias; and
fifth vias extending through the molding compound, respective topmost surfaces of the respective fifth vias being coplanar with a topmost surface of the local interconnect, wherein at least one fifth via is above and physically connects with a respective one of the first vias.

9. The semiconductor device of claim 8, further comprising a core substrate solder bonded to the first redistribution structure.

10. The semiconductor device of claim 8, wherein the molding compound extends continuously from the first side of the local interconnect to the second side of the local interconnect.

11. The semiconductor device of claim 9, further comprising a second molding compound surrounding sidewalls of the core substrate.

12. The semiconductor device of claim 8, further comprising a first integrated circuit die and a second integrated circuit die bonded to the second redistribution structure opposite the local interconnect, wherein the local interconnect electrically connects the first integrated circuit die to the second integrated circuit die.

13. The semiconductor device of claim 8, wherein each of the fourth vias has a same width as each of the third vias.

14. The semiconductor device of claim 8, wherein each of the first vias has a same width as each of the third vias.

15. A device comprising:
a core substrate having a first outermost end and a second outermost end opposite the first outermost end;
a first redistribution structure comprising a first conductive via embedded in a first dielectric layer, the first redistribution structure being vertically stacked above the core substrate, the first redistribution structure having a third outermost end co-terminus with the first outermost end of the core substrate and having a fourth outermost end co-terminus with the second outermost end of the core substrate, and further wherein the first dielectric layer extends from the first outermost end to the second outermost end of the core substrate;
a local interconnect structure vertically stacked above the first redistribution structure and comprising;
   a first conductive connector embedded in a second dielectric layer, wherein the first conductive connector contacts the first conductive via and the first dielectric layer contacts the second dielectric layer; and
   a second conductive connector embedded in a third dielectric layer, wherein the third dielectric layer being disposed on an opposite side of the local interconnect structure from the second dielectric layer;
a second redistribution structure comprising a second conductive via, wherein the second conductive via contacts the second conductive connector; and
a molding compound having a topmost surface contacting a bottommost surface of the first redistribution structure and encapsulating the local interconnect structure.

16. The device of claim 15, wherein the second redistribution structure further comprises a third conductive via having a different width than the second conductive via, and wherein the first redistribution structure further comprises a fourth conductive via having a different width than the first conductive via.

17. The device of claim 16, further comprising a through via extending through the molding compound from a first side of the local interconnect structure to a second side of the local interconnect structure.

18. The device of claim 17, wherein the through via contacts both the third conductive via and the fourth conductive via.

19. The device of claim 15, wherein the core substrate is bonded to the first redistribution structure opposite the local interconnect structure.

20. The device of claim 15, further comprising a first integrated circuit die and a second integrated circuit die bonded to the second redistribution structure opposite the local interconnect structure, wherein the local interconnect structure overlaps the first integrated circuit die and the second integrated circuit die.

* * * * *